United States Patent
Tsai et al.

(10) Patent No.: US 10,014,207 B2
(45) Date of Patent: Jul. 3, 2018

(54) METHOD OF MANUFACTURING DIELECTRIC LAYERS OF SEMICONDUCTOR STRUCTURE

(71) Applicant: TAIWAN SEMICONDUCTOR MANUFACTURING COMPANY LTD., Hsinchu (TW)

(72) Inventors: Jia-You Tsai, Taipei (TW); Kung-Wei Lee, New Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/813,707

(22) Filed: Jul. 30, 2015

(65) Prior Publication Data

US 2015/0340276 A1    Nov. 26, 2015

Related U.S. Application Data

(62) Division of application No. 13/968,726, filed on Aug. 16, 2013, now abandoned.

(51) Int. Cl.
| | |
|---|---|
| *H01L 21/762* | (2006.01) |
| *H01L 21/3065* | (2006.01) |
| *H01L 21/02* | (2006.01) |
| *H01L 21/3115* | (2006.01) |
| *H01L 23/532* | (2006.01) |
| *H01L 21/768* | (2006.01) |

(52) U.S. Cl.
CPC .... *H01L 21/76224* (2013.01); *H01L 21/0234* (2013.01); *H01L 21/02129* (2013.01); *H01L 21/02131* (2013.01); *H01L 21/02252* (2013.01); *H01L 21/02266* (2013.01); *H01L 21/02274* (2013.01); *H01L 21/02321* (2013.01); *H01L 21/3065* (2013.01); *H01L 21/31155* (2013.01); *H01L 21/76826* (2013.01); *H01L 21/76837* (2013.01); *H01L 23/5329* (2013.01); *H01L 23/53295* (2013.01); *H01L 2924/0002* (2013.01)

(58) Field of Classification Search
CPC ......... H01L 21/76224; H01L 21/76227; H01L 21/76229; H01L 21/76232; H01L 21/76235; H01L 21/76237; H01L 21/76801–21/76837
See application file for complete search history.

(56) References Cited

U.S. PATENT DOCUMENTS

| | | | | |
|---|---|---|---|---|
| 6,261,975 B1 * | 7/2001 | Xia | ........................ | C23C 16/401 257/E21.243 |
| 6,802,944 B2 * | 10/2004 | Ahmad | .................. | C23C 16/045 204/192.23 |

(Continued)

*Primary Examiner* — Eric Ward
(74) *Attorney, Agent, or Firm* — WPAT, P.C., Intellectual Property Attorneys; Anthony King

(57) ABSTRACT

A method of filling a dielectric trench includes forming two adjacent conductors on a substrate, forming a dielectric layer over a surface of the conductors and the substrate, removing a portion of the dielectric layer, treating a top surface of the dielectric layer with phosphorous plasma, and repeating the forming the dielectric layer, the removing the portion of the dielectric layer, and the treating the top surface of the dielectric layer in a multi cycle fashion. A narrowest width of the dielectric trench between the two adjacent conductors is smaller than about 30 nm.

16 Claims, 26 Drawing Sheets

(56) References Cited

U.S. PATENT DOCUMENTS

| | | | |
|---|---|---|---|
| 7,211,525 B1* | 5/2007 | Shanker | C23C 16/0245 |
| | | | 257/E21.279 |
| 7,524,750 B2* | 4/2009 | Nemani | H01L 21/76224 |
| | | | 257/E21.276 |
| 7,745,350 B2* | 6/2010 | Wang | C23C 16/045 |
| | | | 257/E21.218 |
| 9,070,624 B2* | 6/2015 | Chen | H01L 29/78 |
| 2007/0059900 A1* | 3/2007 | Lai | H01L 21/31116 |
| | | | 438/435 |
| 2008/0254593 A1* | 10/2008 | Eun | H01L 21/76224 |
| | | | 438/425 |
| 2012/0115298 A1* | 5/2012 | Kim | H01L 21/28123 |
| | | | 438/299 |
| 2012/0325773 A1* | 12/2012 | Lee | C23C 16/045 |
| | | | 216/37 |

* cited by examiner

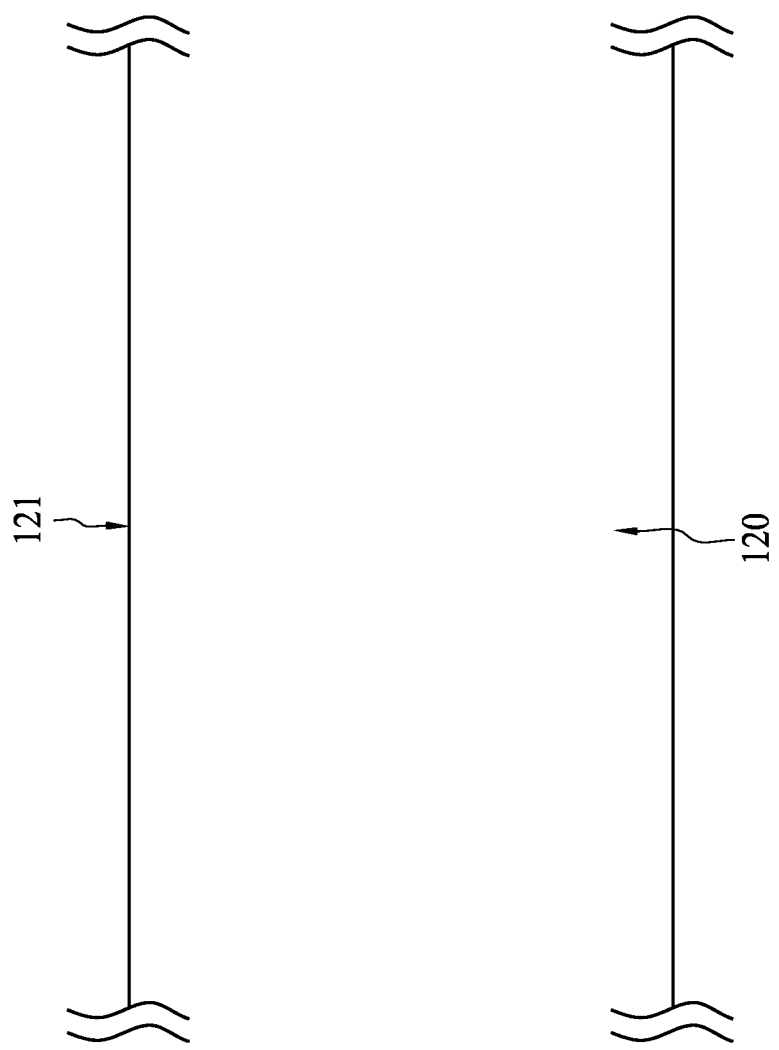

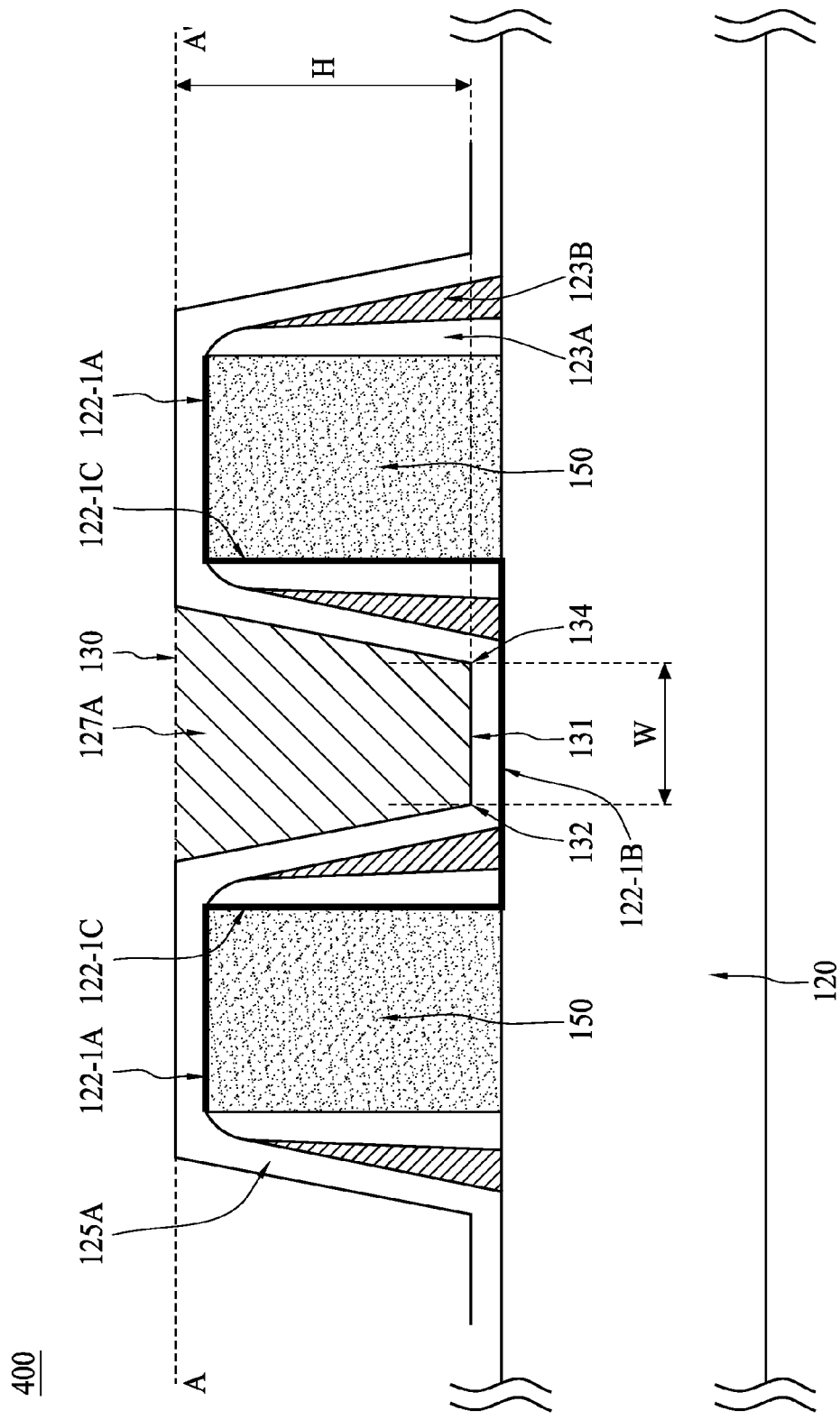

US 10,014,207 B2

METHOD OF MANUFACTURING DIELECTRIC LAYERS OF SEMICONDUCTOR STRUCTURE

CROSS-REFERENCE TO RELATED APPLICATION

This application is a Divisional of U.S. application Ser. No. 13/968,726, filed Aug. 16, 2013.

FIELD

The disclosure relates to a method of forming a dielectric feature in a semiconductor structure.

BACKGROUND

Semiconductor devices are widely used in different fields as costs and physical dimensions reduce with advancing technologies. Structures of semiconductor devices become more and more complicated because transistor density per unit area increases. Multilevel of conductive pattern features are also adopted to improve performance of semiconductor devices.

Dielectric material is adopted as a structure in semiconductor devices to isolate transistors in different regions. Dielectric material is also utilized to separate conductive patterns located in different levels. As the geometry shrinks, a multi-step method is used to grow the dielectric material in a multi-layer manner. However, the interface between each layer is a weak point of the dielectric material.

BRIEF DESCRIPTION OF THE DRAWINGS

Aspects of the present disclosure are best understood from the following detailed description when read with the accompanying figures. It is emphasized that, in accordance with the standard practice in the industry, some features are not drawn to scale. In fact, the dimensions of the some features may be arbitrarily increased or reduced for clarity of discussion.

FIGS. 3A-3G are schematic diagrams illustrating a method of manufacturing the semiconductor structure in FIG. 1 at an STI stage, according to some embodiments of the present disclosure.

FIG. 4 is an exemplary semiconductor structure at an ILD stage, according to some embodiments of the present disclosure.

DETAILED DESCRIPTION OF THE INVENTION

According to the present disclosure, a dielectric material is introduced in a semiconductor structure. The dielectric material is arranged as a gap filling film between pattern features in some stages. In some embodiments, the dielectric material acts as an isolation filled in a trench of a substrate. In some embodiments, the dielectric material acts as an isolation between conductive lines. The conductive lines are electrically conductive or semi-conductive.

In some embodiments of the present disclosure, concentration of phosphorus is substantially constant across the dielectric material. In some embodiments, fluorine concentration changes in a substantially linear manner across the dielectric material. In some embodiments, the dielectric layer is a portion of the dielectric material.

In the present disclosure, some exemplary stages are used to illustrate some embodiments. A shallow trench isolation (STI) stage refers to a stage in which STI structures are defined. The STI structures are designed to isolate transistor gates, sources, drains, etc. An inter layer dielectric (ILD) stage is in between formation of a transistor gate and formation of a first metal layer. An IMD stage is after the ILD stage.

Semiconductor Structure at STI Stage

Figure 1:
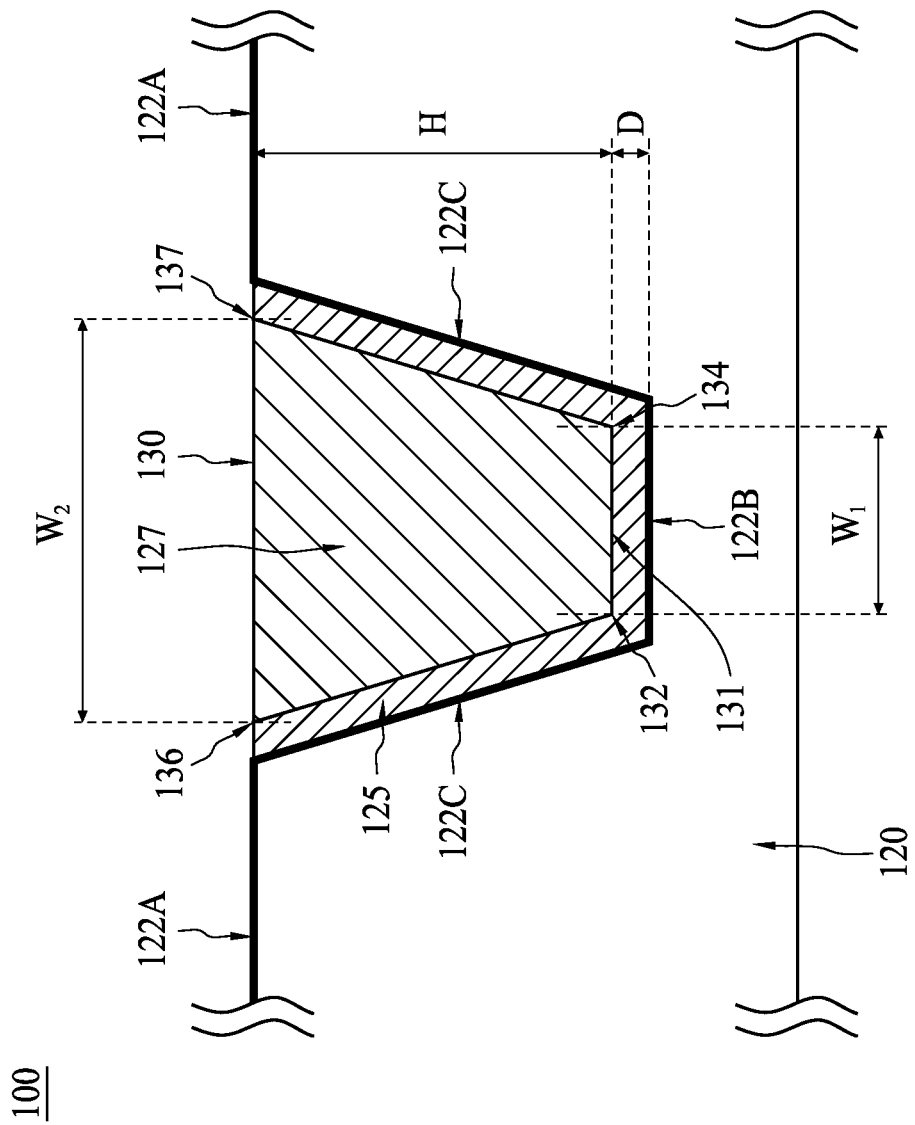
FIG. 1 is a schematic of a semiconductor structure, in accordance with some embodiments of the present disclosure

FIG. 1 is an exemplary semiconductor structure 100 at an STI stage, in accordance with some embodiments. A semiconductor substrate 120 of the semiconductor structure 100 provides a foundation to form semiconductor circuitry. In some embodiments, the substrate 120 is a silicon substrate with a first conductivity type, which is a p-type, for example. In some embodiments, the substrate 120 has several doped regions. Some of the doped regions have a second conductivity type opposite to the first conductivity type. Some of the doped regions have the first conductivity type with a higher concentration than that of the substrate 120. The semiconductor substrate 120 has a surface 122 (not labeled in the drawing) that includes two portions 122A, two portions 122C, and a portion 122B. The surface 122 is a jagged surface and is illustrated by a coarse line in FIG. 1. Each portion 122C is in between a corresponding portion 122A and the portion 122B. The portion 122B is connected with two portions 122C.

A liner 125 is disposed on the surface 122. As illustratively shown in FIG. 1, the liner 125 is disposed on the portion 122B and two portions 122C of the surface 122. In some embodiments not shown in FIG. 1, the liner 125 is also disposed on two portions 122A. The liner 125 has a thickness D between about 50 Å and 700 Å. In some embodiments, the liner 125 is electrically isolative.

A dielectric material 127 is disposed on the liner 125. In some other embodiments that there is not the liner 125, the dielectric material 127 is directly disposed on the portion 122B and two portions 122C. The dielectric material 127 has a predetermined shape, which is determined by the portion 122B and two portions 122C. As illustratively shown in FIG. 1, the dielectric material 127 has a shape of a trapezoid. In some other embodiments, the dielectric material 127 has a shape of a quadrilateral. Other shapes of the dielectric material 127 are within the contemplated scope of the present disclosure.

The dielectric material 127 has predetermined dimensions, such as a first width $W_1$, a second width $W_2$ and a height H. As shown in FIG. 1, the width $W_1$ is defined by a corner 132 and a corner 134 of the dielectric material 127. The width $W_2$ is defined by a corner 136 and a corner 137 of the dielectric material 127. The height H is defined by a top surface 130 of the dielectric material 127 and a bottom surface 131 of the dielectric material 127. In FIG. 1, the bottom surface 131 is an interface between the dielectric material 127 and the liner 125. The dielectric material 127 has an aspect ratio, which is defined by a ratio of the height H over the width $W_1$ of the dielectric material 127. In some embodiments, the height H is greater than 72 nm and the width W is smaller than 30 nm. As a result, the aspect ratio of the dielectric material 127 is 2.4. In some embodiments, the aspect ratio of the dielectric material 127 is greater than 2.4, and is, for example, 2.8, 3.5, etc. In some embodiments, such as a 40 nm CMOS width (complementary metal oxide semiconductor) device, the aspect ratio of the dielectric material 127 in the STI stage is greater than 2.4 in order to meet the design rule. Other values of the aspect ratio are within the contemplated scope of the present disclosure.

Figure 2:
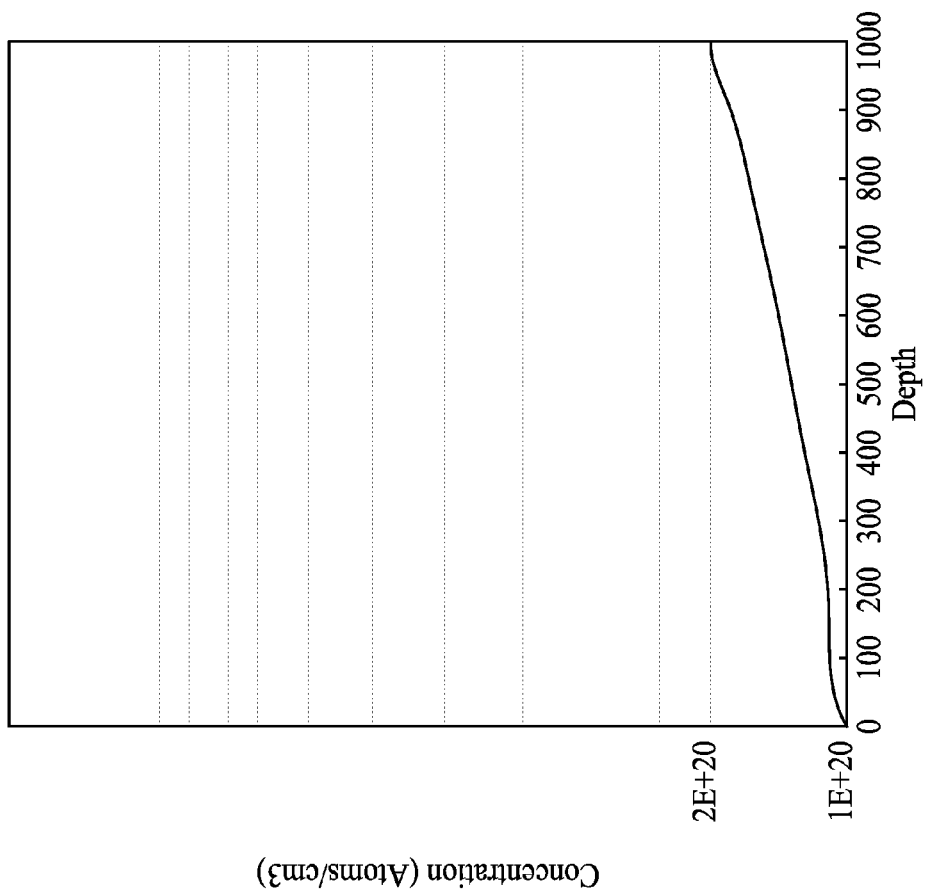
FIG. 2 is a fluorine concentration distribution in a dielectric material of the structure in FIG. 1, according to some embodiments of the present disclosure.

The dielectric material 127 has a silicon glass matrix and electrically isolates active regions in the substrate 120. In some embodiments with references to FIG. 1, the dielectric material 127 has a fluorine ion in the silicon glass matrix. FIG. 2 is a graph representing fluorine concentration distribution in the dielectric material 127 according to some embodiments. The fluorine concentration is measured by a secondary ion mass spectrometer (SIMS), an Auger electron nanoscope (Auger) or other suitable analysis tools. In FIG. 2, the Y-axis represents the fluorine concentration in atomic ratio per cubic centimeters (Atoms/cm$^3$). The X-axis represents a depth of the dielectric material 127 that is referenced from the top surface 130 of the dielectric material 127, and the unit is Å.

In the illustration of FIG. 2, the dielectric material 127 has a depth of about 1000 Å. The depth is also the height H of the dielectric material 127 shown in FIG. 1. The fluorine concentration is thus illustrated from 0 Å to about 1000 Å. From 0 Å to about 1000 Å, the fluorine concentration changes from about 1×E20 Atoms/cm$^3$ to about 2×E20 Atoms/cm$^3$. Effectively, the fluorine concentration is lowest at the surface 130 and is highest at the interface 131.

FIGS. 3A-3G are cross sectional views of the semiconductor structure 100 at the STI stage illustrated in FIG. 1, according to some embodiments of the present disclosure.

Figure 3B:
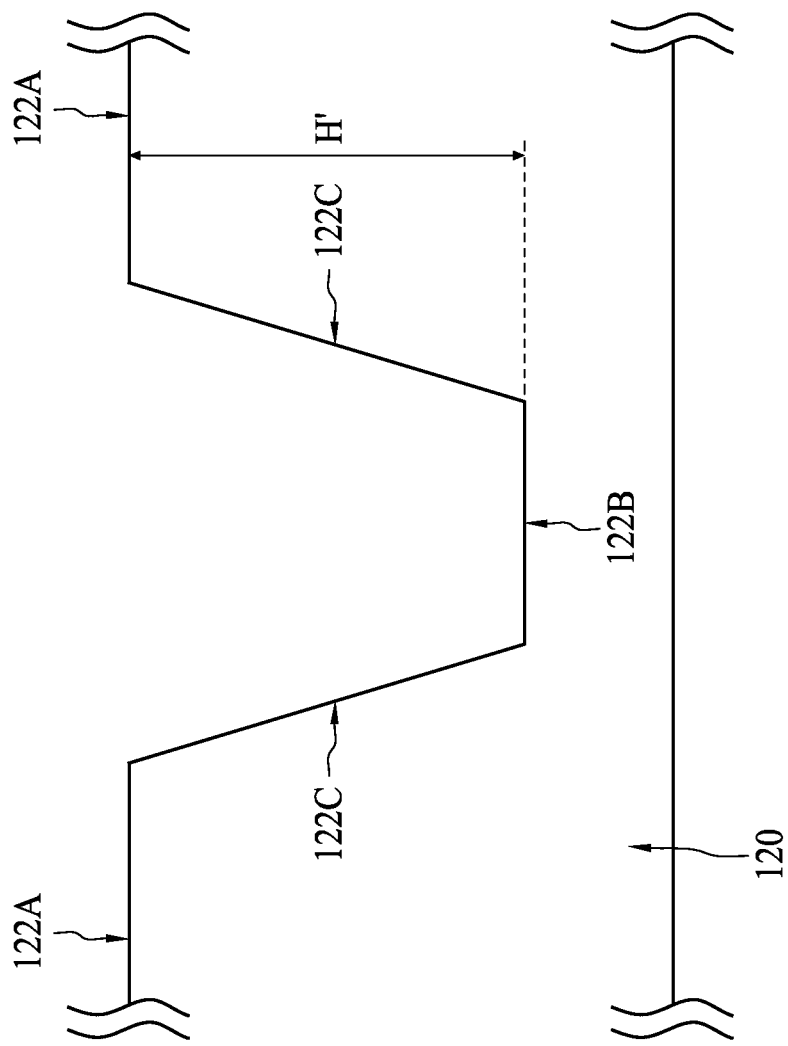

In FIG. 3A, a substrate 120 having a surface 121 is provided. In FIG. 3B, a portion of the substrate 120 is removed to form a trench in the substrate 120. Two portions labeled 122A are remaining portions of the surface 121 in FIG. 3B. Two sidewalls of the trench correspond to two portions 122C in FIG. 1. A bottom surface of the trench corresponds to the portion 122B in FIG. 1. Two portions 122A, two portions 122C and portion 122C form the surface 122 in FIG. 1. The trench has a height H' defined as a distance from the surface portion 122A and the surface portion 122B.

Figure 3C:
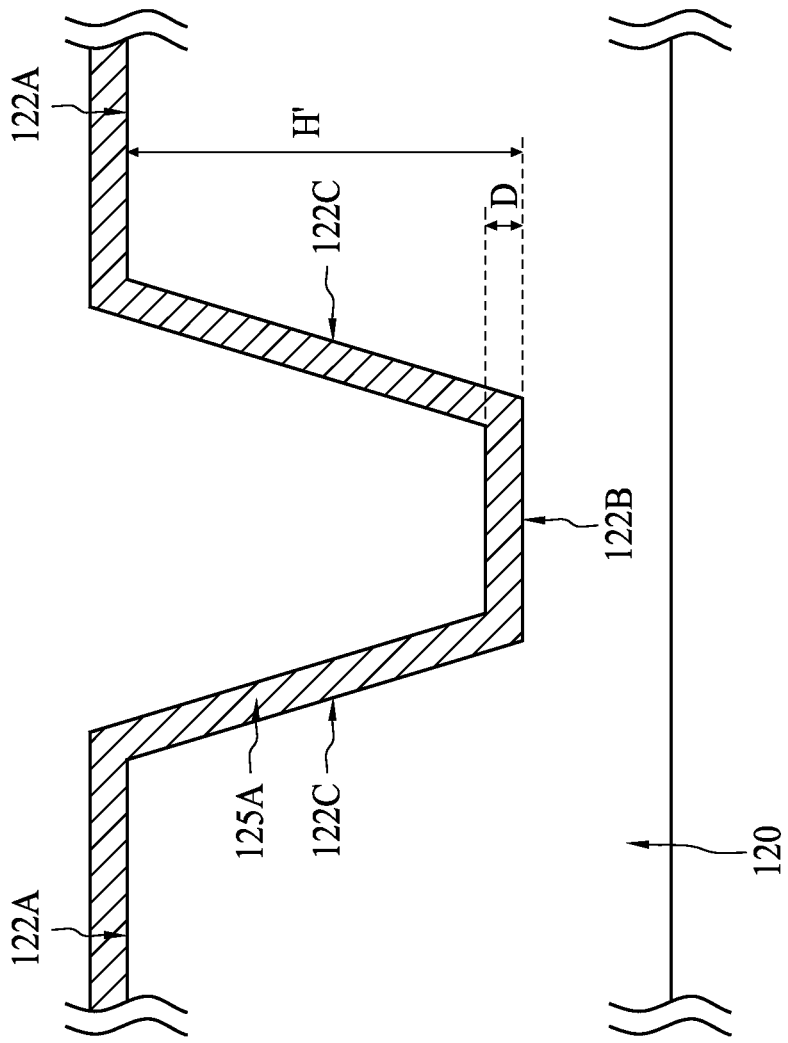
Figure 3D:
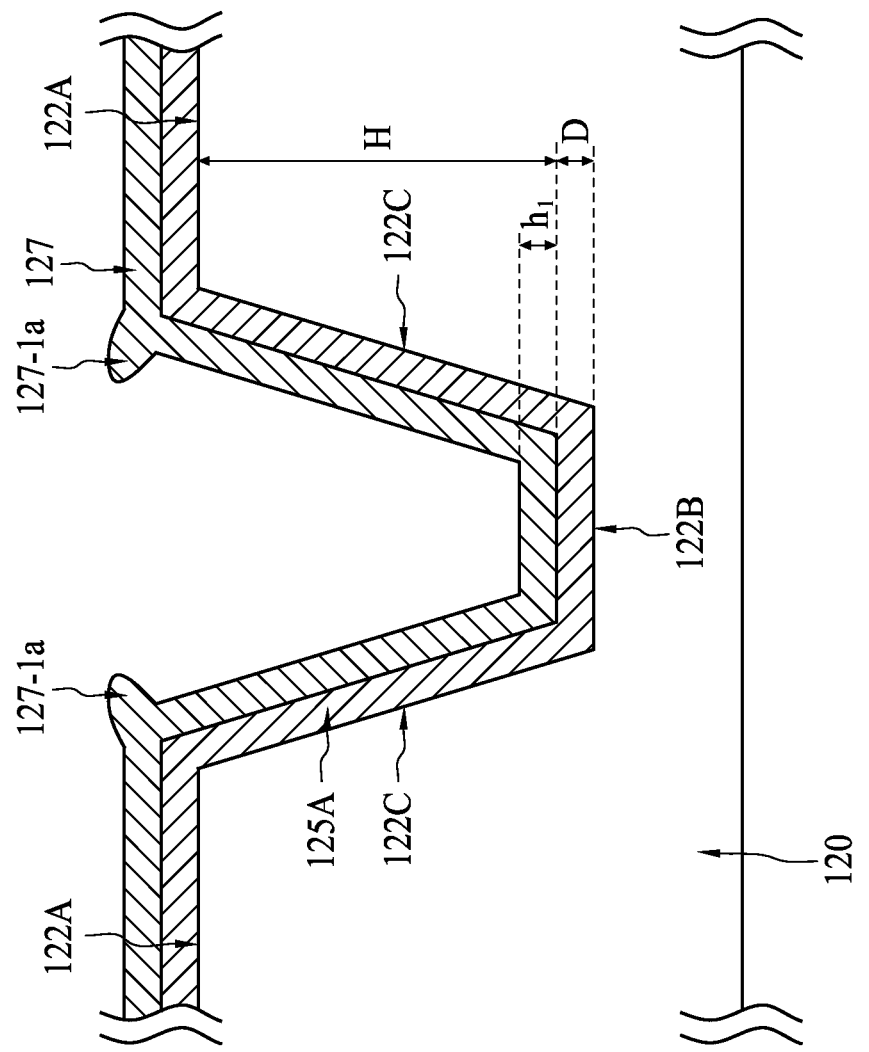

In FIG. 3C, a layer 125A is formed on the surface 122. The layer 125A has a thickness D referenced from the bottom of the trench. In FIG. 3D, a dielectric layer 127-1 is formed on the layer 125A. Effectively, the dielectric layer 127-1 is also formed over the surface 122. In some embodiments without the liner 125, the dielectric layer 127-1 is formed on the surface 122. The dielectric layer 127-1 has a thickness $h_1$.

A chemical vapor deposition (CVD) process is used to form the dielectric layer 127A. In some embodiments, the CVD process is a high density plasma (HDP) or high aspect ratio process (HARP). The CVD process includes a deposition step and an insitu sputter step. The deposition step is to form some dielectric material in the trench and the insitu sputter step uses ions such as argon ions to remove a portion of the dielectric material. The dielectric layer 127-1 in FIG. 3D is a final profile formed by the CVD process. The dielectric layer 127-1 has two overhangs 127-1a.

Figure 3E:
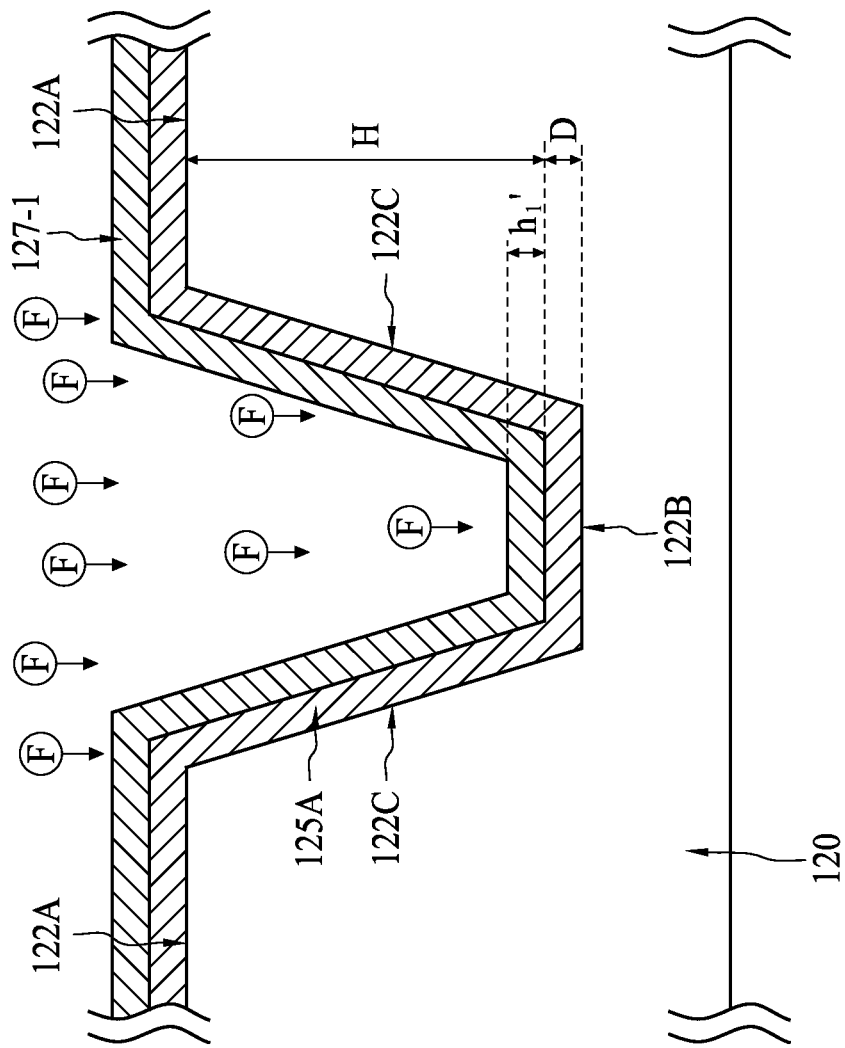

In FIG. 3E, an insitu etch step is used to remove a portion of the dielectric layer 127-1. During this operation, the overhangs 127-1a in FIG. 3D are removed. In some embodiments as illustrated with reference to FIG. 3E, an NF$_3$ gas is ionized to remove the portion of the dielectric layer 127-1. A circle with an "F" represents a fluorine ion of the ionized NF3 gas. The thickness of the dielectric layer 127-1 is reduced to $h_1'$. In some embodiments, the thickness $h_1'$ is about ⅙ of the height H. The height H is defined by a surface portion 122A and the interface between the dielectric layer 127-1 and the liner 125.

Figure 3F:
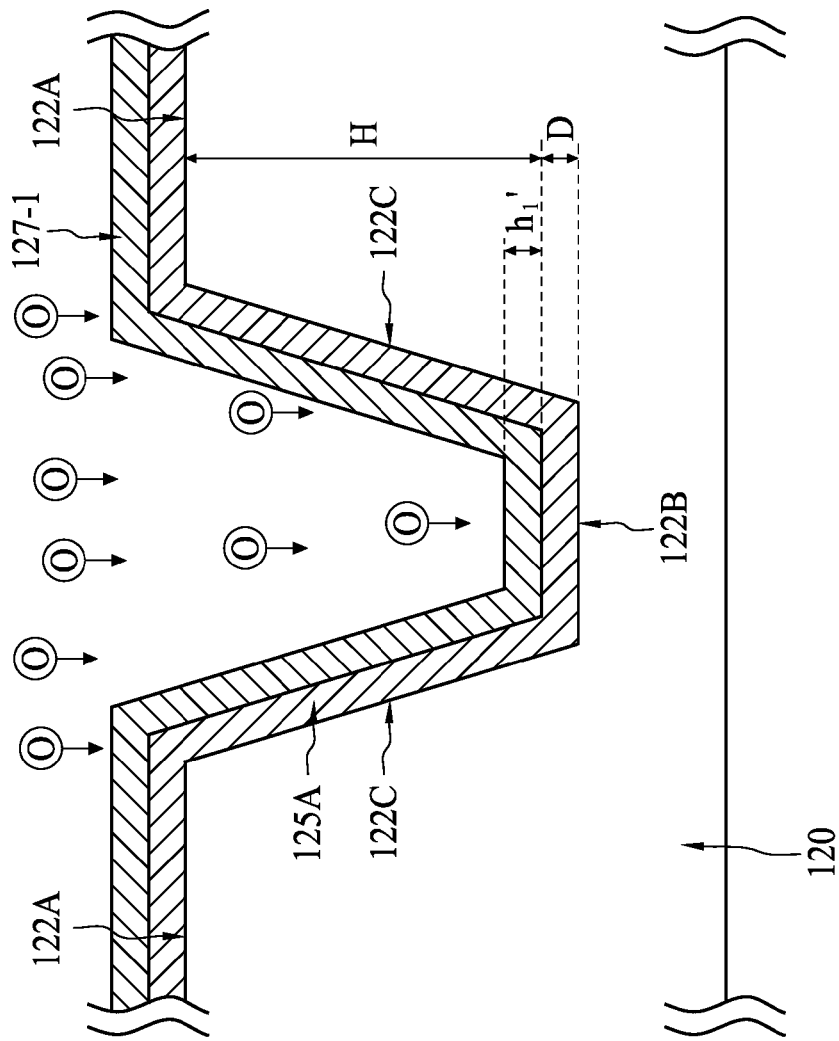

In FIG. 3F, an operation to treat a top surface of the dielectric layer 127-1 with plasma is illustrated. In this operation, a gas is introduced and ionized by a first radio frequency (RF) power to form the plasma. In some embodiments, the gas is oxygen and the first RF power is between about 1000 W and 9000 W. A circle with an "O" illustrates an oxygen ion. A second RF power is also introduced to accelerate the plasma to treat the top surface of the dielectric layer 127-1. In some embodiments, the second RF power is between about 1000 W and 9000 W. During this operation, fluorine concentration at the top surface of the dielectric layer 127-1 is adjusted. The fluorine concentration in the dielectric layer 127-1 changes in a linear manner.

Figure 3G:
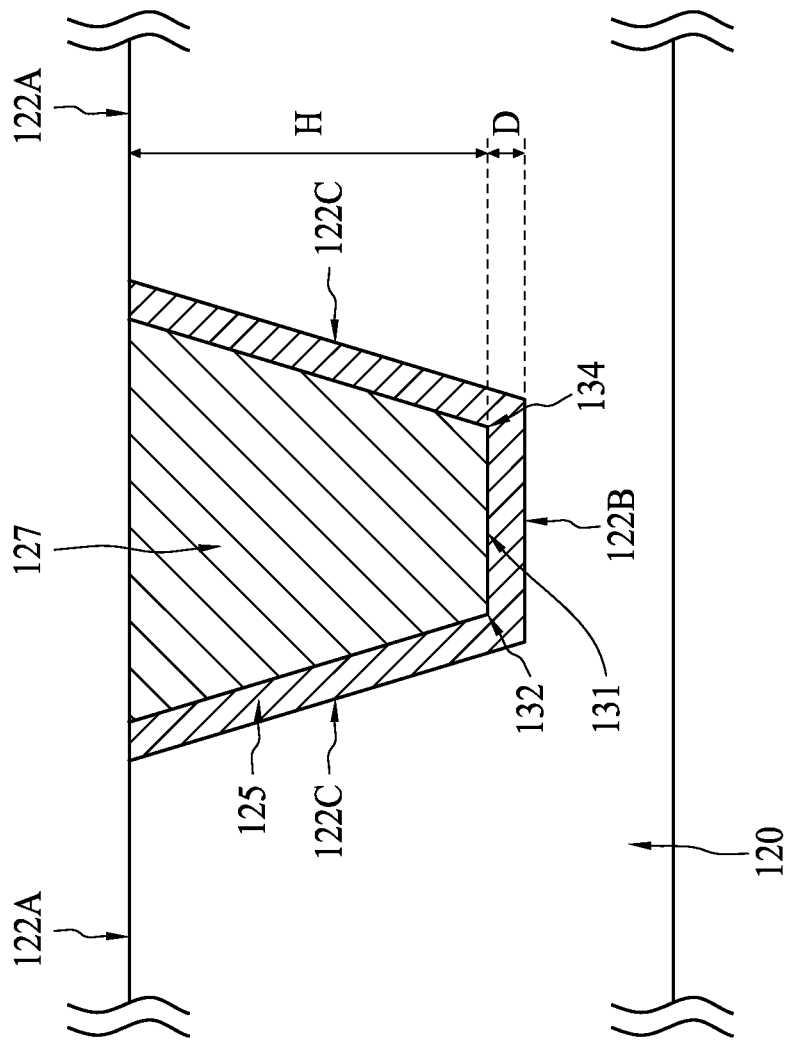

In some embodiments, several cycles are used to form the dielectric material 127 to a predetermined thickness. For example, operations with reference to FIGS. 3D to 3F are repeated to form a cycle of forming the dielectric layer 127-1. In some embodiments as illustrated in FIG. 3G, an operation that repeats the cycle 6-7 times is used to form the dielectric material 127 in the trench having the thickness H. A portion of the layer 125A in FIG. 3F is also removed to result in the liner 125.

Semiconductor Structure at ILD Stage

FIG. 4 is an exemplary semiconductor structure 400 at an ILD stage, in accordance with some embodiments. The semiconductor structure 400 has a surface 122-1 (not labeled in the drawing) and two conductors 150 on the substrate 120. The surface 122-1 includes at least two portions 122-1A, two portions 122-1C, and a portion 122-1B. The portion 122-1A, 122-1B, and 122-1C correspond to the portion 122A, 122B, and 122C in FIG. 1, respectively. The conductors 150 are electrically conductive and, in some embodiments, are gates of the semiconductor structure 400. The two conductors 150 are identical, and the conductor 150 on the right side is used in the exemplary illustration that is also applicable to the other conductor 150. A portion 122-1C is a sidewall of the conductor 150 and a portion 122-1A is a top surface of the conductor 150. A first spacer 123A is adjacent to a sidewall of the conductor 150. A second spacer 123B is adjacent to the first spacer 123A. Spacers 123A and 123B are symmetrical with reference to the conductor 150. In some embodiments, the semiconductor structure 400 has at least one spacer at each side of the conductor 150.

A liner 125A is disposed over the substrate 120 and other locations. For example, a portion of the liner 125A is over the conductors 150, another portion is on the top surface 122-1A of the conductor 150, and another portion is on the spacers 123A and 123B. In some embodiments, the liner 125A is an etch stop layer.

A dielectric material 127A corresponds to the dielectric material 127 in FIG. 1, and includes phosphorous ions in addition to fluorine ions as in the dielectric material 127. The dielectric material 127A also has a silicon glass matrix and electrically isolates the conductors 150.

Figure 5:
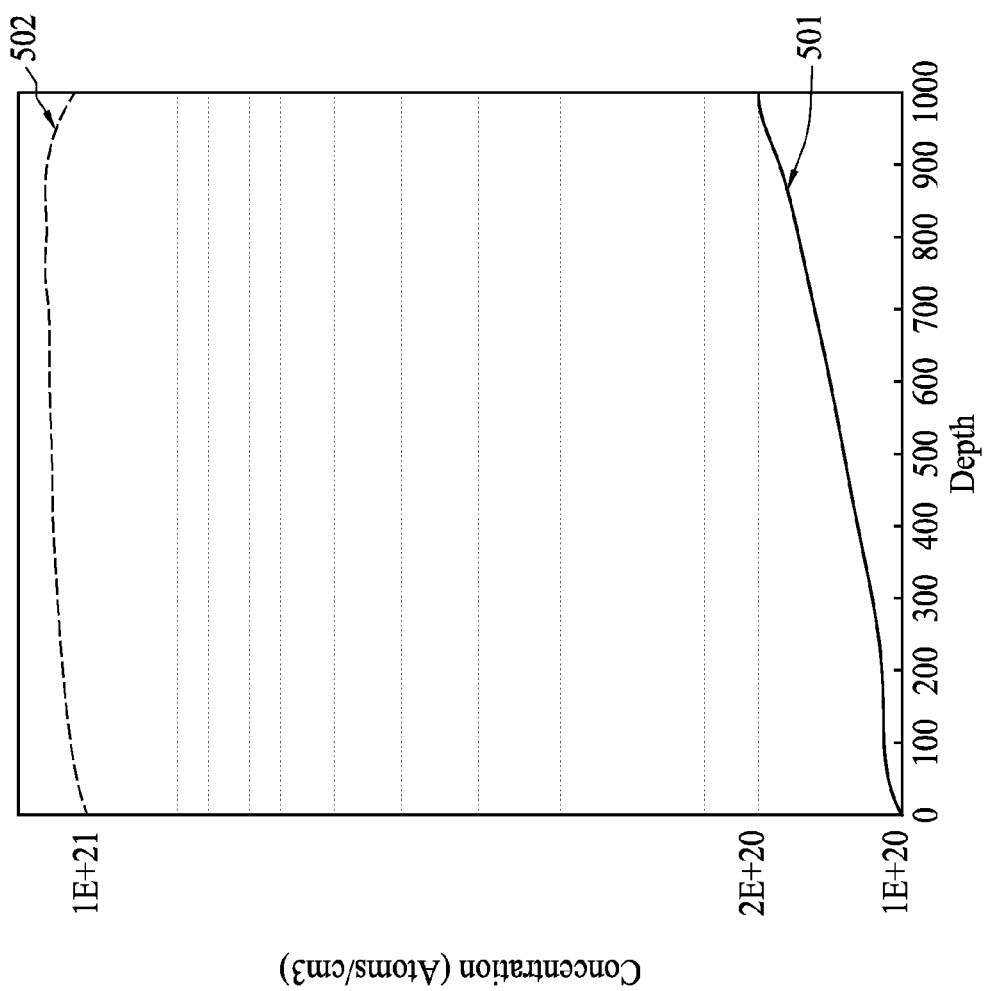
FIG. 5 is a fluorine and phosphorous concentration distribution of a dielectric material in the structure of FIG. 4, according to some embodiments of the present disclosure.

FIG. 5 is a fluorine concentration distribution of the dielectric material 127A in FIG. 4 according to some embodiments. The fluorine concentration is measured by a secondary ion mass spectrometer (SIMS), an Auger electron nanoscope (Auger) or other suitable analysis tools. In FIG. 5, the Y-axis represents the fluorine concentration and the unit is atomic ratio per cubic centimeters (atoms/cm$^3$). The X-axis represents a depth of the dielectric material 127A with reference to a line AA' in FIG. 4, and the unit is Å. Line 501 represents the fluorine concentration versus the depth of the dielectric material 127A. In the illustration of FIG. 5, the dielectric material 127A has a depth of about 1000 Å. The depth is also the height H of the dielectric material 127A. The fluorine concentration is thus illustrated from 0 Å to about 1000 Å. From 0 Å to about 1000 Å, the fluorine concentration changes from about 1×E20 Atoms/cm$^3$ to about 2×E20 Atoms/cm$^3$. Effectively, the fluorine concentration is lowest at the surface 130 shown in FIG. 4 and is highest at the interface 131.

Line 502 represents the phosphorous concentration distribution versus the depth of the dielectric material 127A. In FIG. 5, the phosphorous concentration is substantially constant in the dielectric material 127A.

FIGS. 6A-6H are cross sectional views of the semiconductor structure 400 at the ILD stage illustrated in FIG. 4, according to some embodiments of the present disclosure.

Figure 6A:
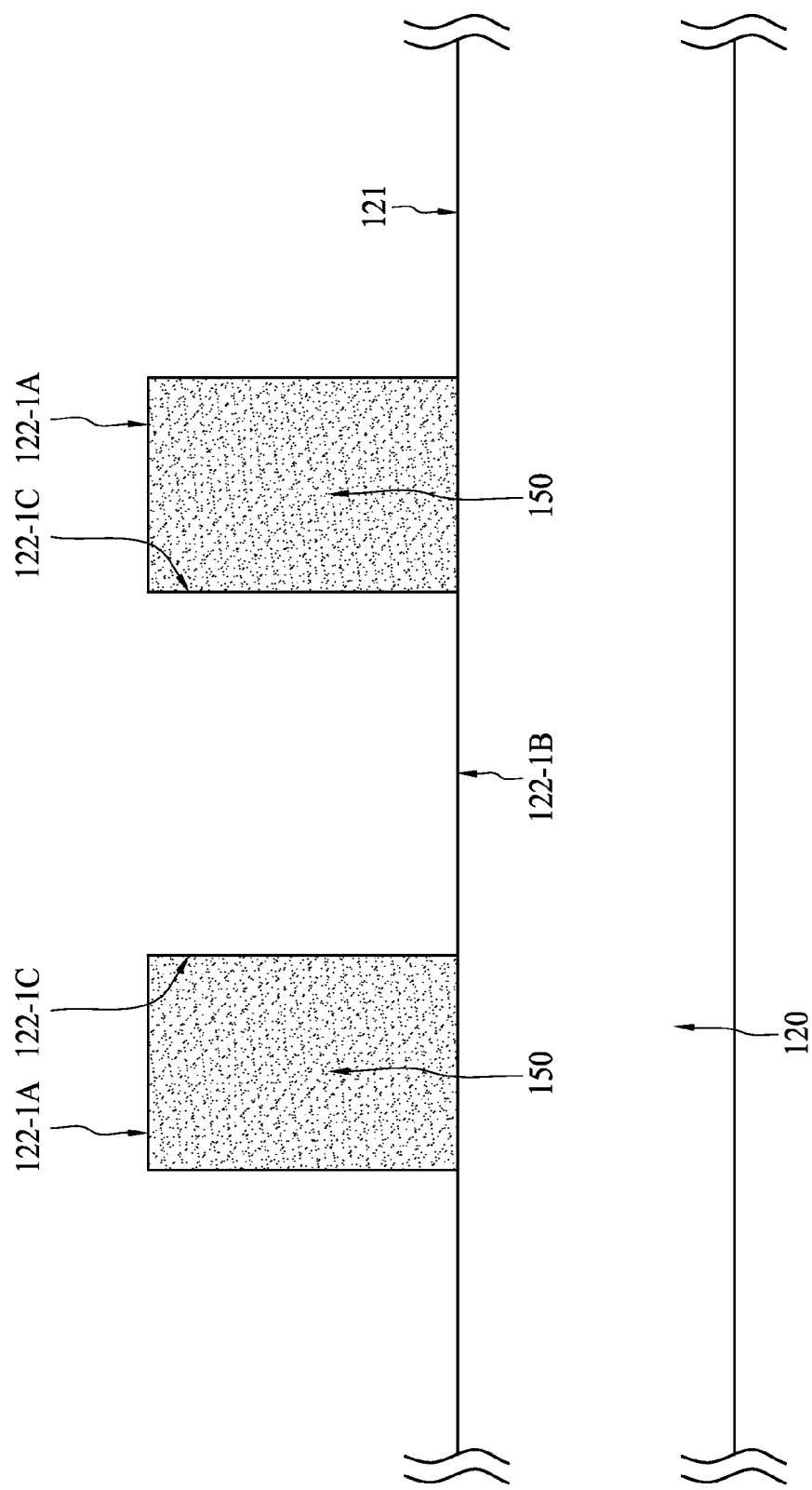
FIGS. 6A-6H are schematic diagrams illustrating a method of manufacturing the semiconductor structure in FIG. 5 at an ILD stage, according to some embodiments of the present disclosure.

In FIG. 6A, two conductors 150 are formed on the surface 121 of the substrate 120. Each conductor 150 includes a sidewall 122-1C. The top surface of each conductor 150 corresponds to the portion 122-1A in FIG. 4. A portion of the surface 121 between the two conductors 150 corresponds to the portion 122-1B in FIG. 4.

Figure 6B:
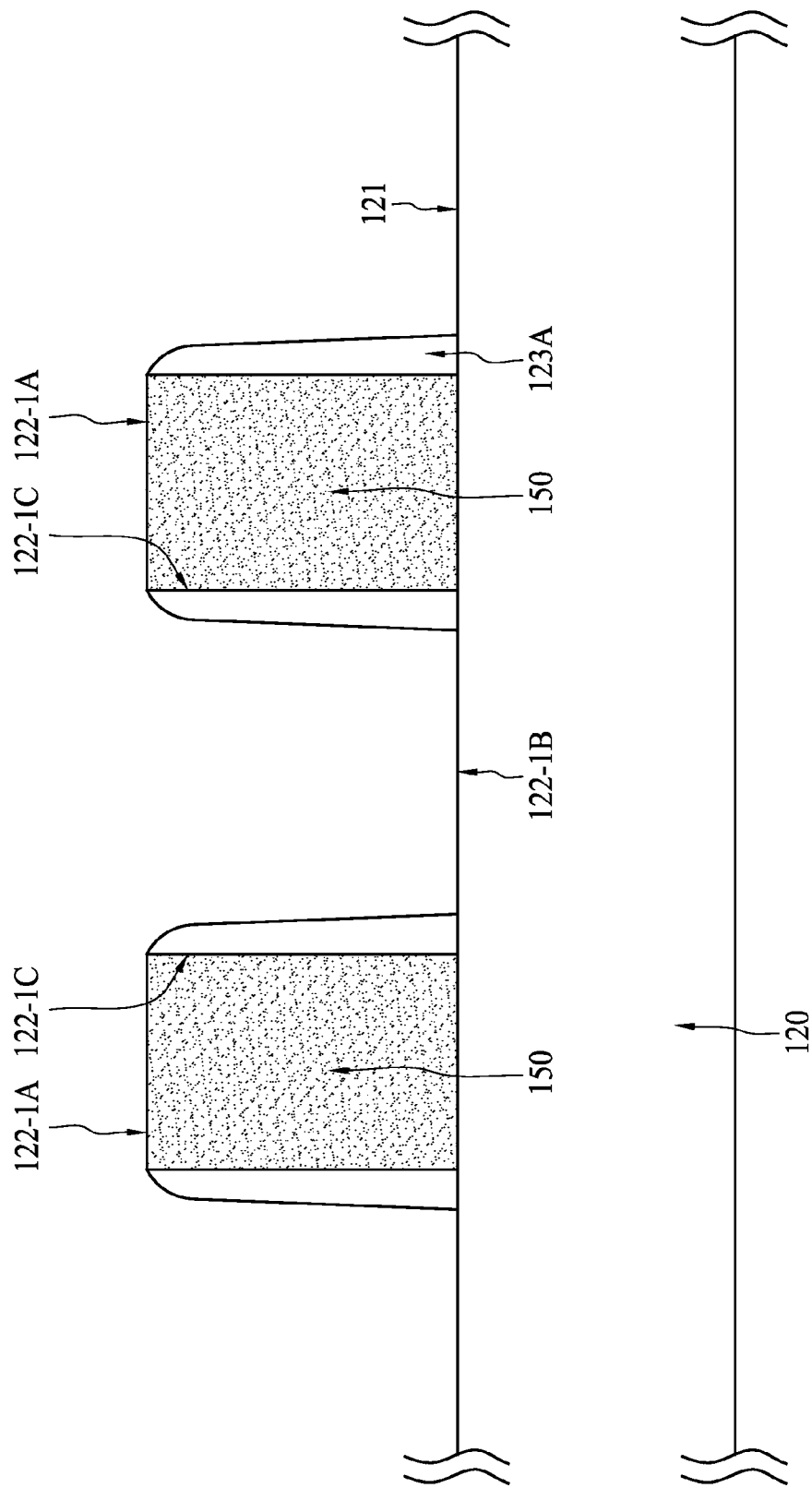
Figure 6C:
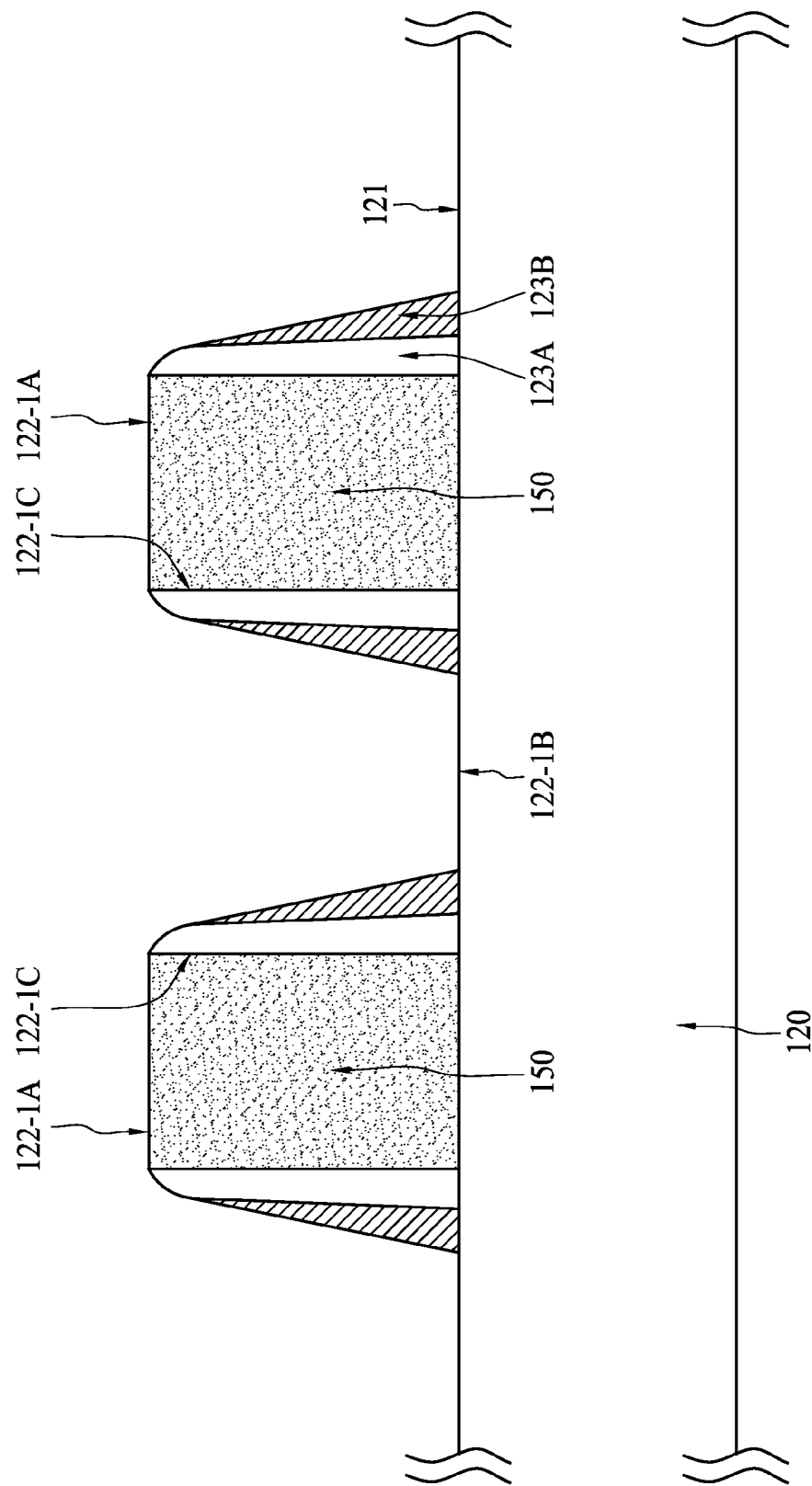

In FIG. 6B, a first spacer 123A is formed on a corresponding sidewall 122-1C of the conductors 150. In FIG. 6C, a second spacer 123B is formed adjacently to the first spacer 123A. For simplicity, only elements associated with one conductor 150 are labeled.

Figure 6D:
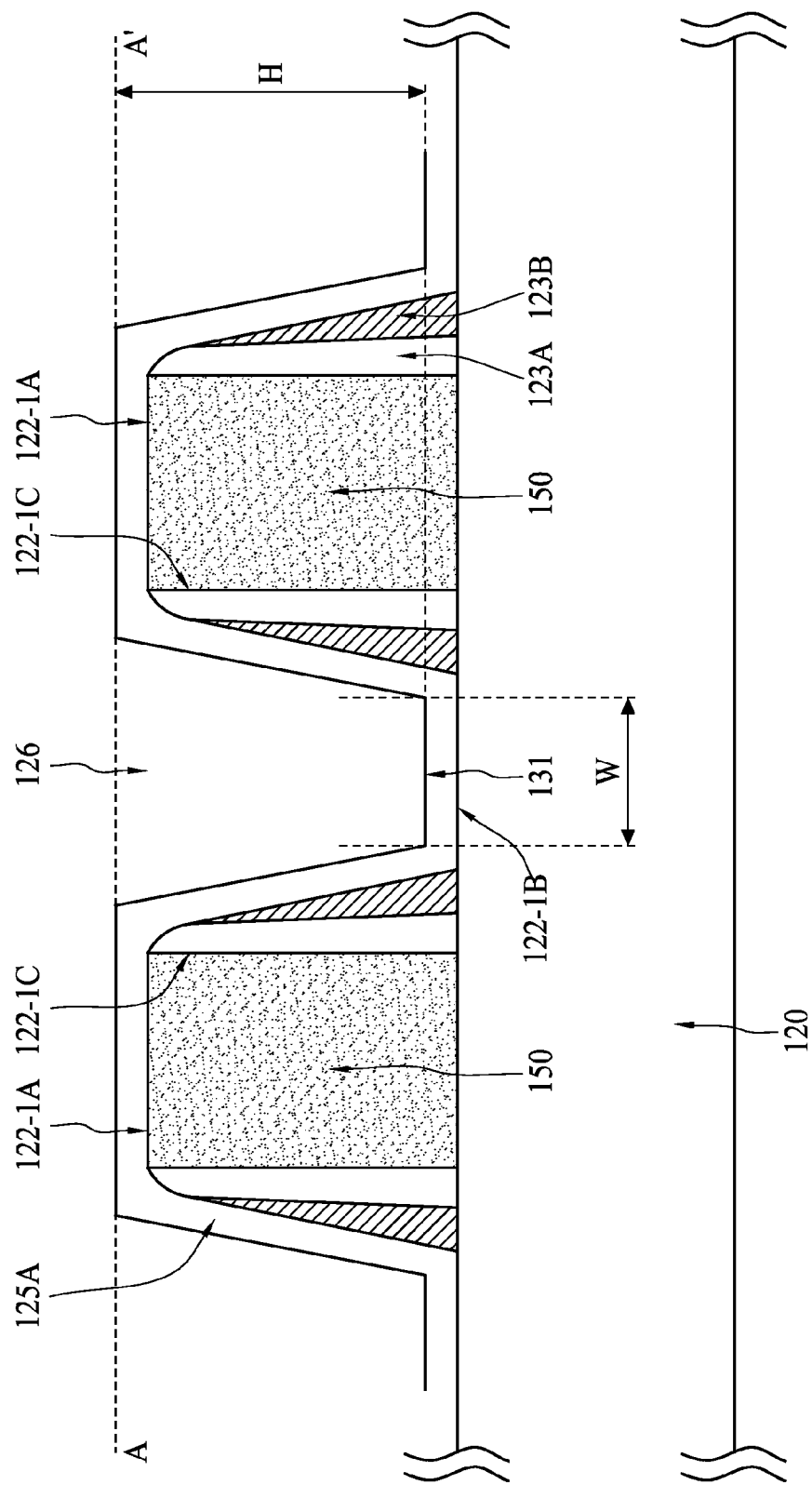

In FIG. 6D, a liner 125A is formed and covers the top surface 122-1A of the conductor 150 and on the spacers 123A and 123B. A portion of the liner 125A is on the bottom surface 122-1B. An opening 126 between the conductors 150 has a height H and a width W.

Figure 6E:
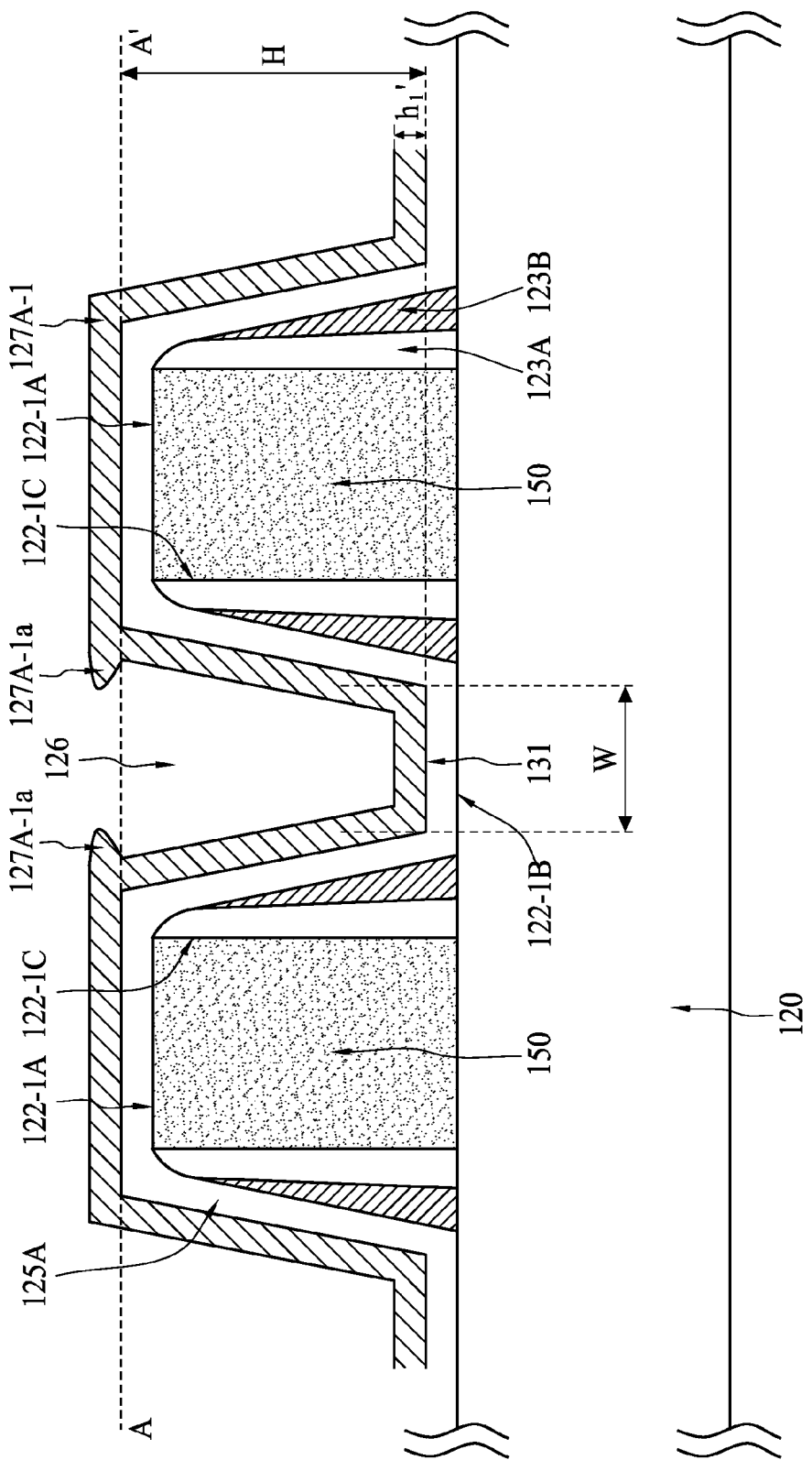

In FIG. 6E, a doped chemical vapor deposition (CVD) process is used to form a dielectric layer 127A-1 on the liner 125A. In some embodiments, the doped CVD process is a high density plasma (HDP) or HARP process. The dopant is phosphorous ions. The doped chemical vapor deposition includes a deposition step and an insitu sputter step. The deposition step forms doped dielectric material on the liner 125A. The insitu sputter step uses ion such as argon ions and removes a portion of the doped dielectric material.

Figure 6F:
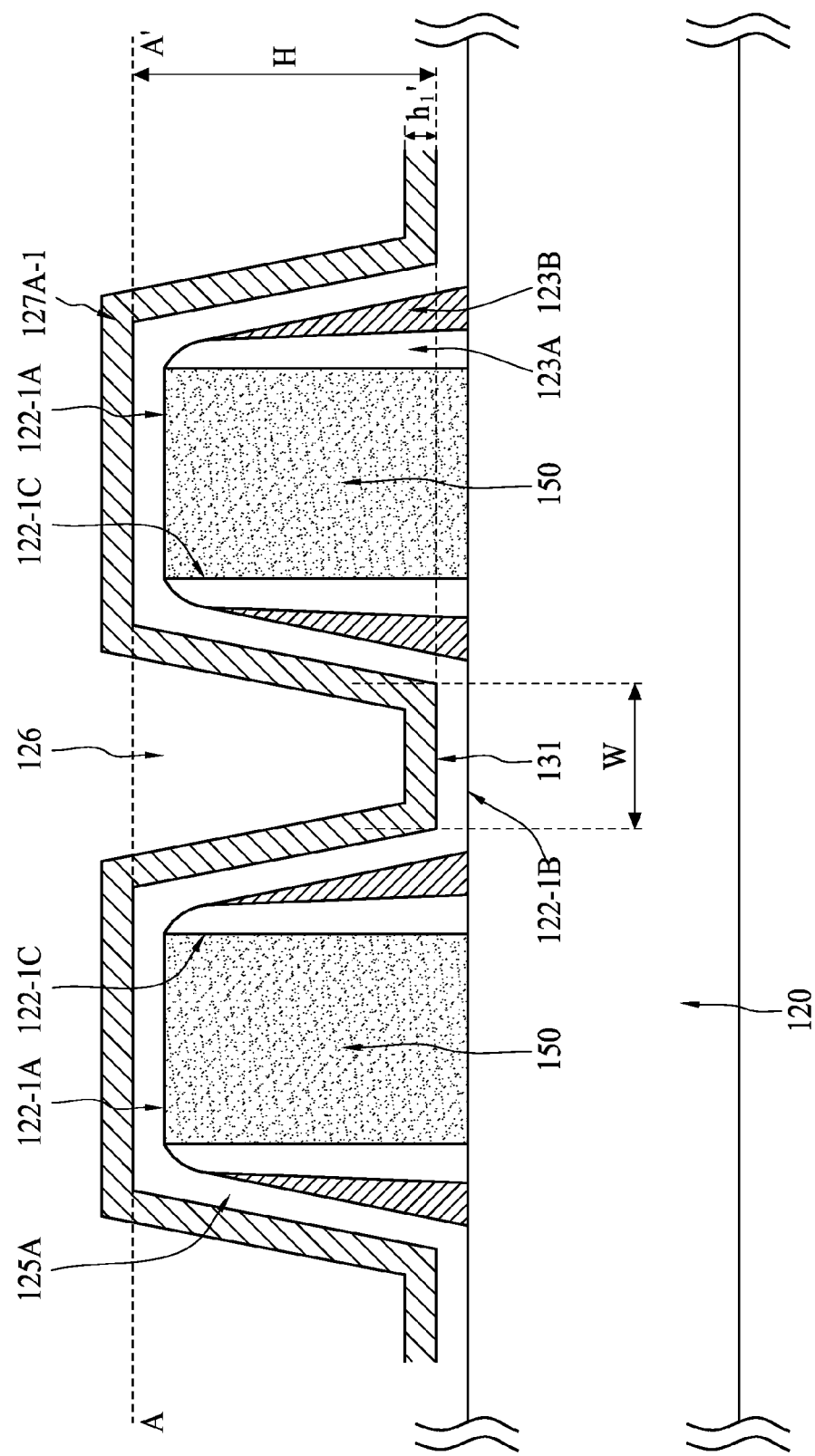

A same fluorine ion etch process as illustrated in FIG. 3E is adopted to remove the overhangs 127A-1a after the operation in FIG. 6E. FIG. 6F illustrates the height of dielectric layer 127A-1 is reduced to h$_1$'.

Figure 6G:
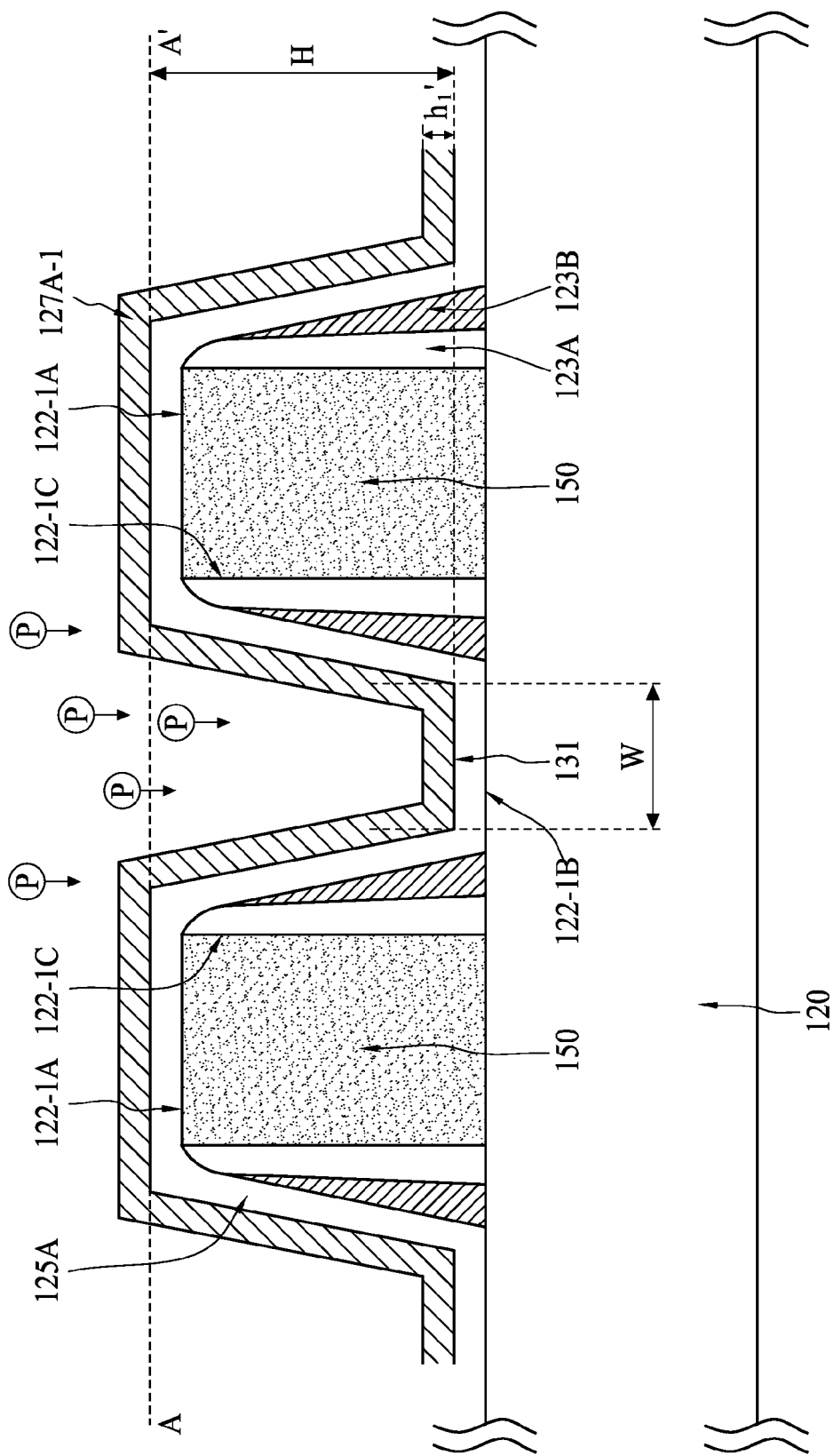
Figure 6H:
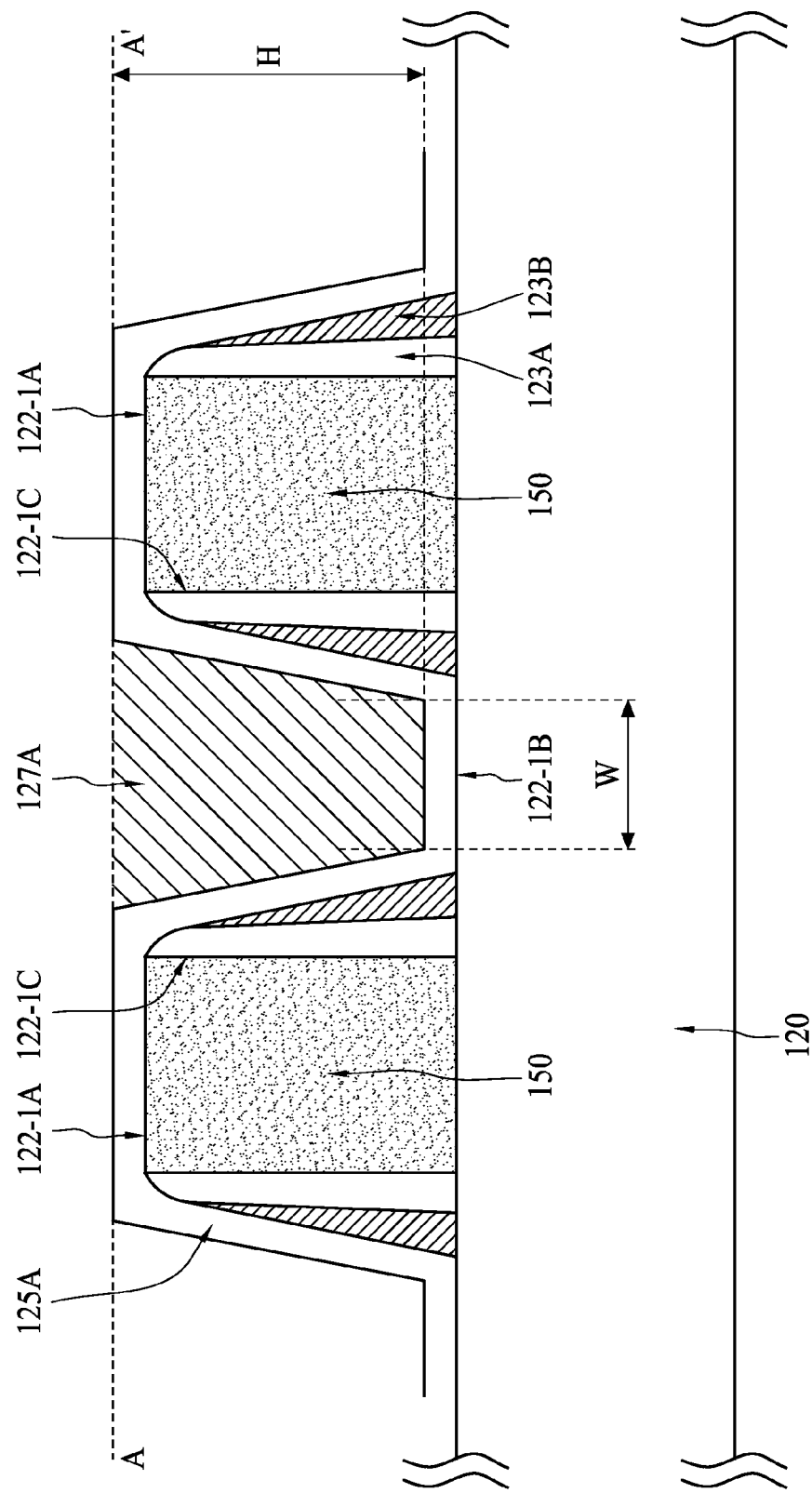

In FIG. 6G, an operation to treat a top surface of the dielectric layer 127A-1 with plasma is illustrated. For some embodiments, a PH$_3$ gas is introduced and ionized by a first radio frequency (RF) power to form the plasma. Phosphorous ions are generated from the ionized PH$_3$ gas. A circle with a "P" illustrates an phosphorous ion. A second RF power is also introduced to accelerate the plasma to treat the top surface of the dielectric layer 127A-1. The magnitude of the first and the second RF powers are as illustrated with reference to FIGS. 3A-3G. During the first and second RF operations, phosphorous concentration at the top surface of the dielectric layer 127A-1 is adjusted. The phosphorous concentration in the dielectric layer 127A-1 is substantially constant throughout the dielectric layer 127A-1. Fluorine concentration at the top surface of the dielectric layer 127A-1 is adjusted to change in a linear manner throughout the dielectric layer 127A-1.

In some embodiments, several cycles are used to form the dielectric material 127A to a predetermined height. For example, operations with reference to FIGS. 6E to 6G are repeated as a cycle to form the dielectric layer 127A-1. An operation that repeats the cycle 6-7 times is used and results in the dielectric material 127A having the height H.

Semiconductor Structure at IMD Stage

Figure 7:
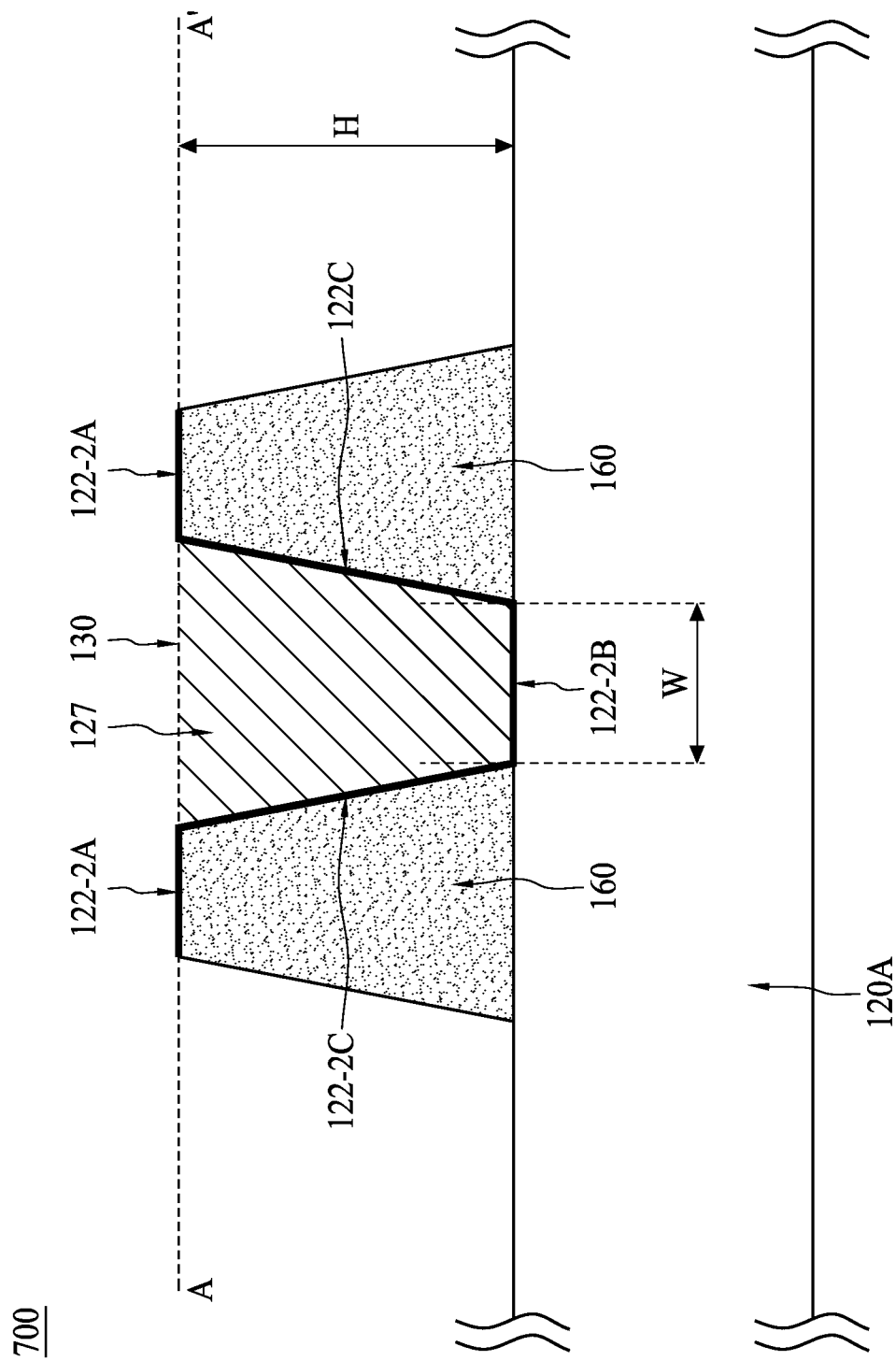
FIG. 7 is an exemplary semiconductor structure at an IMD stage, according to some embodiments of the present disclosure.

FIG. 7 is an exemplary semiconductor structure 700 at an IMD stage, in accordance with some embodiments. The semiconductor structure 700 has a surface 122-2 not labeled in the drawing) and two conductors 160 on a substrate 120A. The surface 122-2 includes at least two portions 122-2A two portions 122-2C and a portion 122-2B. The portion 122-2A, 122-2B, and 122-2C correspond to the portion 122A, 122B, and 122C in FIG. 1, respectively. In some embodiments, the conductors 160 include metal. The substrate 120A corresponds to the substrate 120 in FIG. 1, and, in addition to silicon, also includes metal and dielectric.

A dielectric material 127 is on the portions 122-2C and the portion 122-2B. In some embodiments, a liner 125A (not shown in the drawing) is between the dielectric material 127 and the surface 122-2. The dielectric material 127 has a fluorine ion in the silicon glass matrix. The dielectric material 127 has a height H. In some embodiments, the height of the dielectric material 127 is dependent on a height of the conductor 160.

Figure 8:
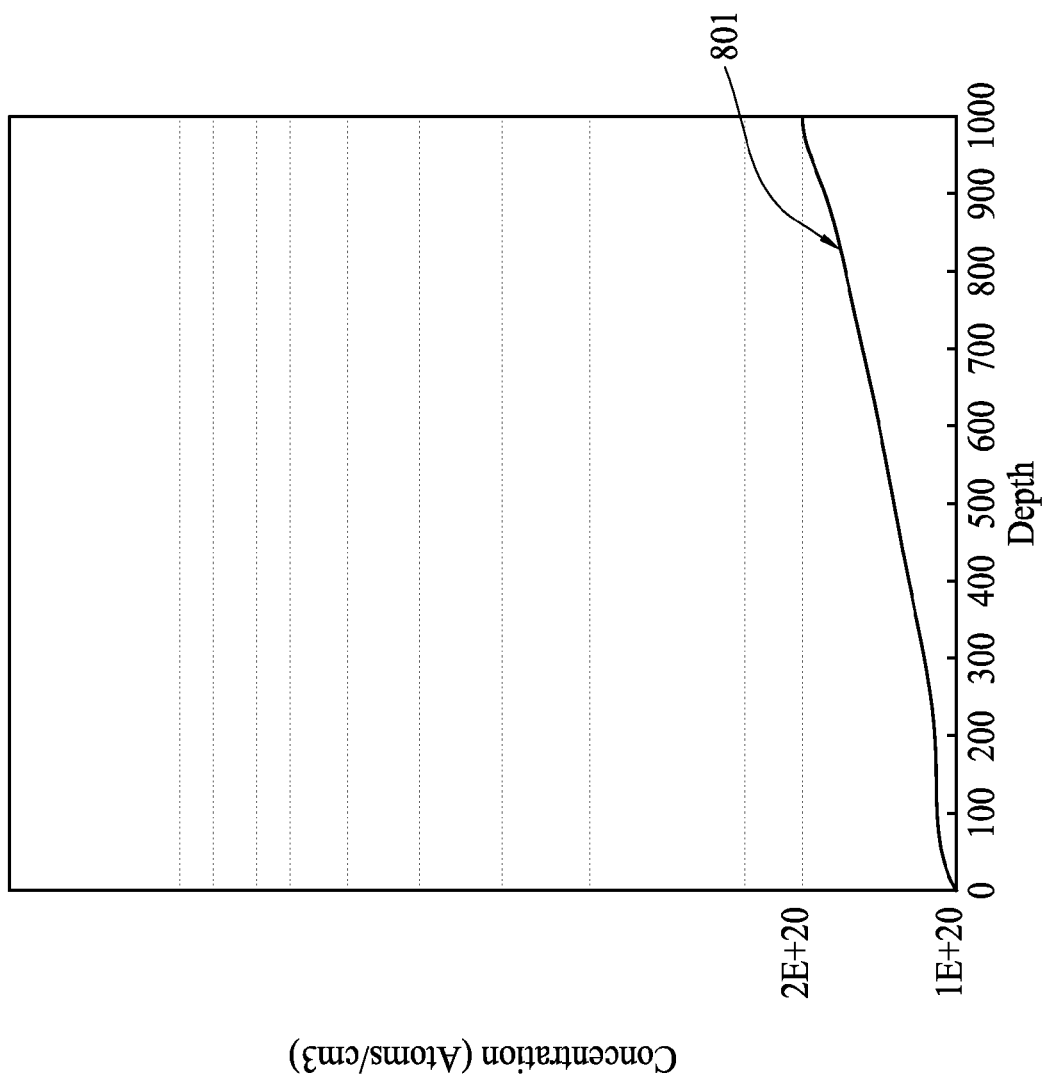
FIG. 8 is a fluorine concentration distribution of a dielectric material of the structure in FIG. 7, according to some embodiments of the present disclosure.

FIG. 8 is a fluorine concentration distribution in the dielectric material 127 according to some embodiments. The X-axis represents a depth of the dielectric material 127 with reference to a line AA' in FIG. 7, and the unit is Å. Line 801 represents the fluorine concentration versus the depth of the dielectric material 127.

In the illustration of FIG. 8, the dielectric material 127 has a depth of about 1000 Å. The depth is also the height H of the dielectric material 127. For the embodiments as illustrated in FIG. 8, the fluorine concentration is thus illustrated from 0 Å to about 1000 Å, which is substantially equal to the height H of the dielectric material 127. Other values of the height are within the contemplated scope of the present disclosure. From 0 Å to about 1000 Å, the fluorine concentration changes from about 1×E20 Atoms/cm$^3$ to about 2×E20 Atoms/cm$^3$. Effectively, the fluorine concentration is lowest at the surface 130 and is highest at the portion 122-2B.

FIGS. 9A-9E are cross sectional views of the semiconductor structure 700 at the IMD stage illustrated in FIG. 7, according to some embodiments of the present disclosure.

Figure 9A:
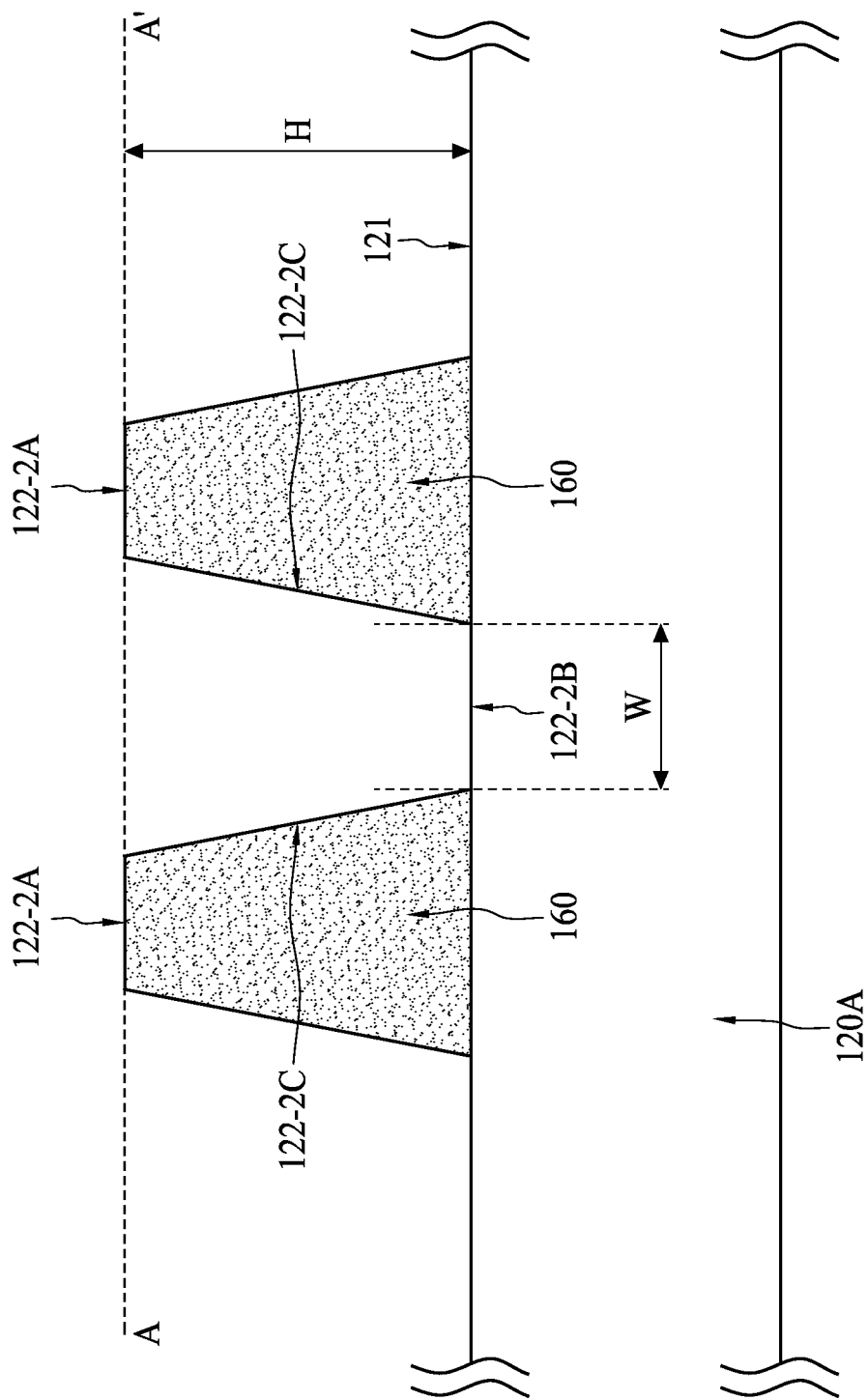
FIGS. 9A-9E are schematic diagrams illustrating a method of manufacturing the semiconductor structure in FIG. 8 at IMD stage, according to some embodiments of the present disclosure.
Figure 9B:
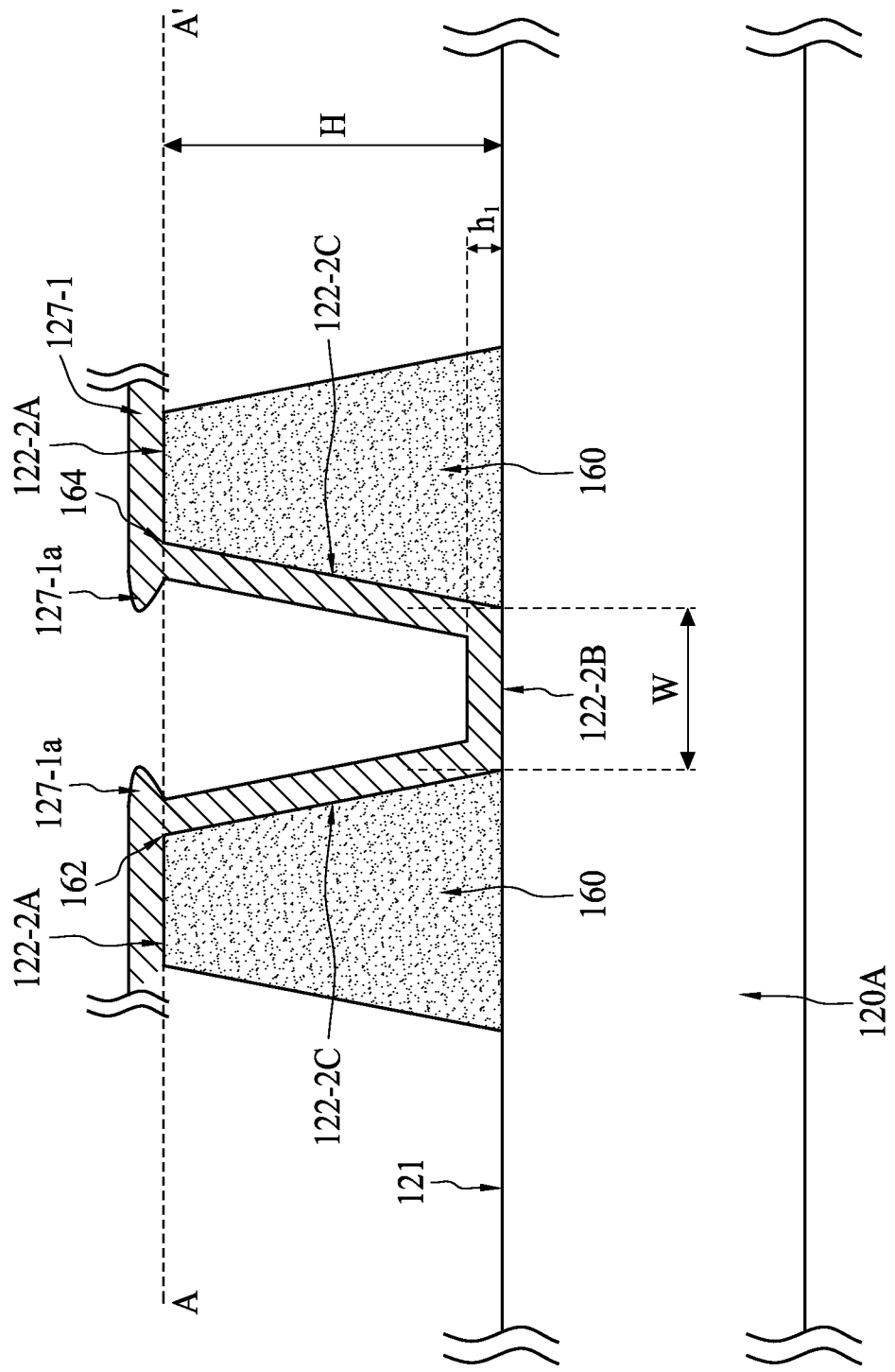

In FIG. 9A, two conductors 160 are formed on a surface 121 of a substrate 120A. In some embodiments with referenced to FIG. 9A, the conductor 150 has a shape of a trapezoid. In FIG. 9B, a CVD process is used to form a dielectric layer 127-1 on the portions 122-2A, 122-2B and 122-2C. In some embodiments, the CVD process is a HDP or HARP process. Two overhangs 127-1a are formed on top corners 164 of the conductors 160.

Figure 9C:
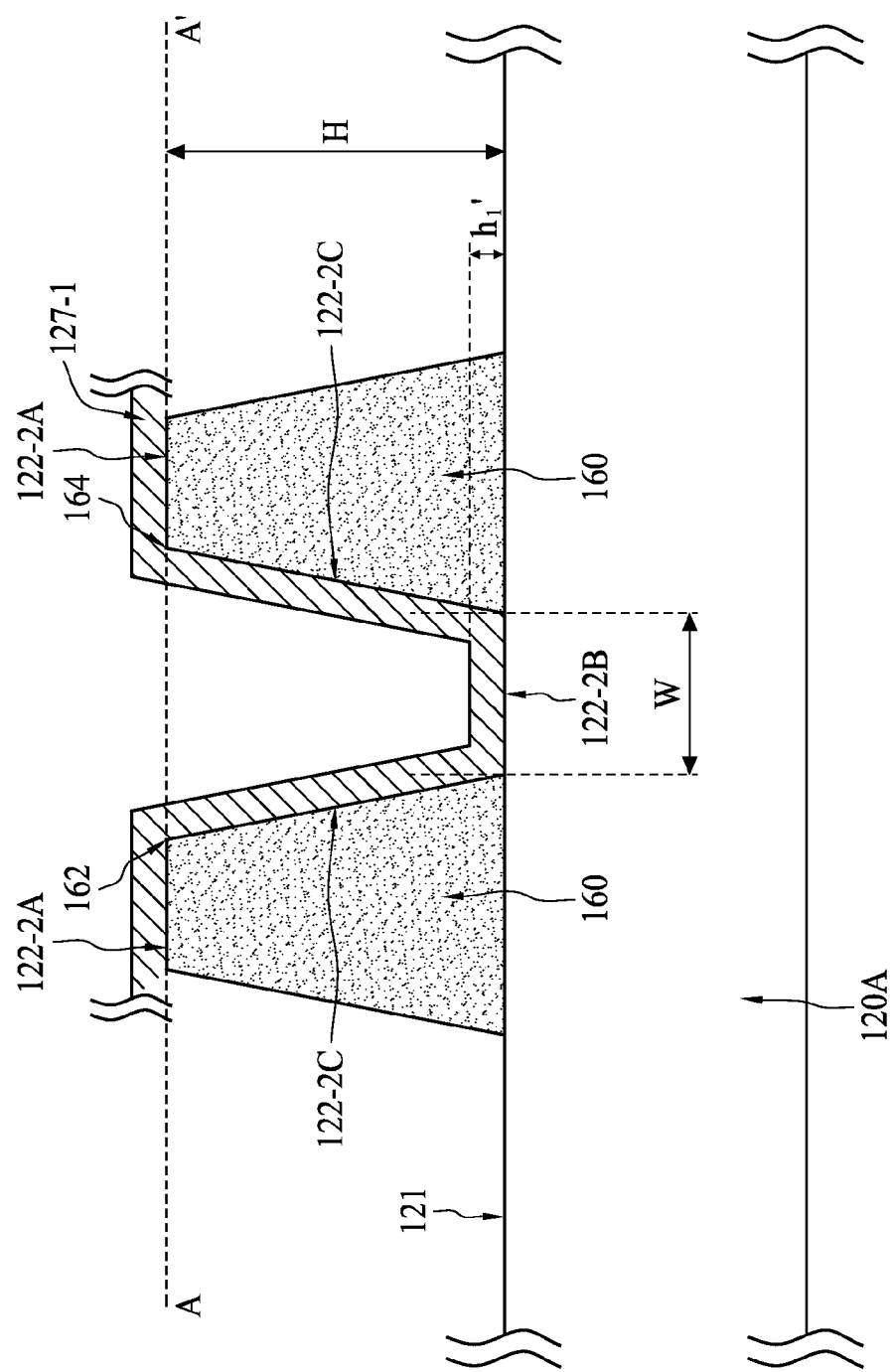

A same fluorine ion etch process illustrated in FIG. 3E is adopted to remove the overhangs 127-1a. The thickness of the dielectric layer 127-1 is reduced to $h_1'$ as illustrated in FIG. 9C.

Figure 9D:
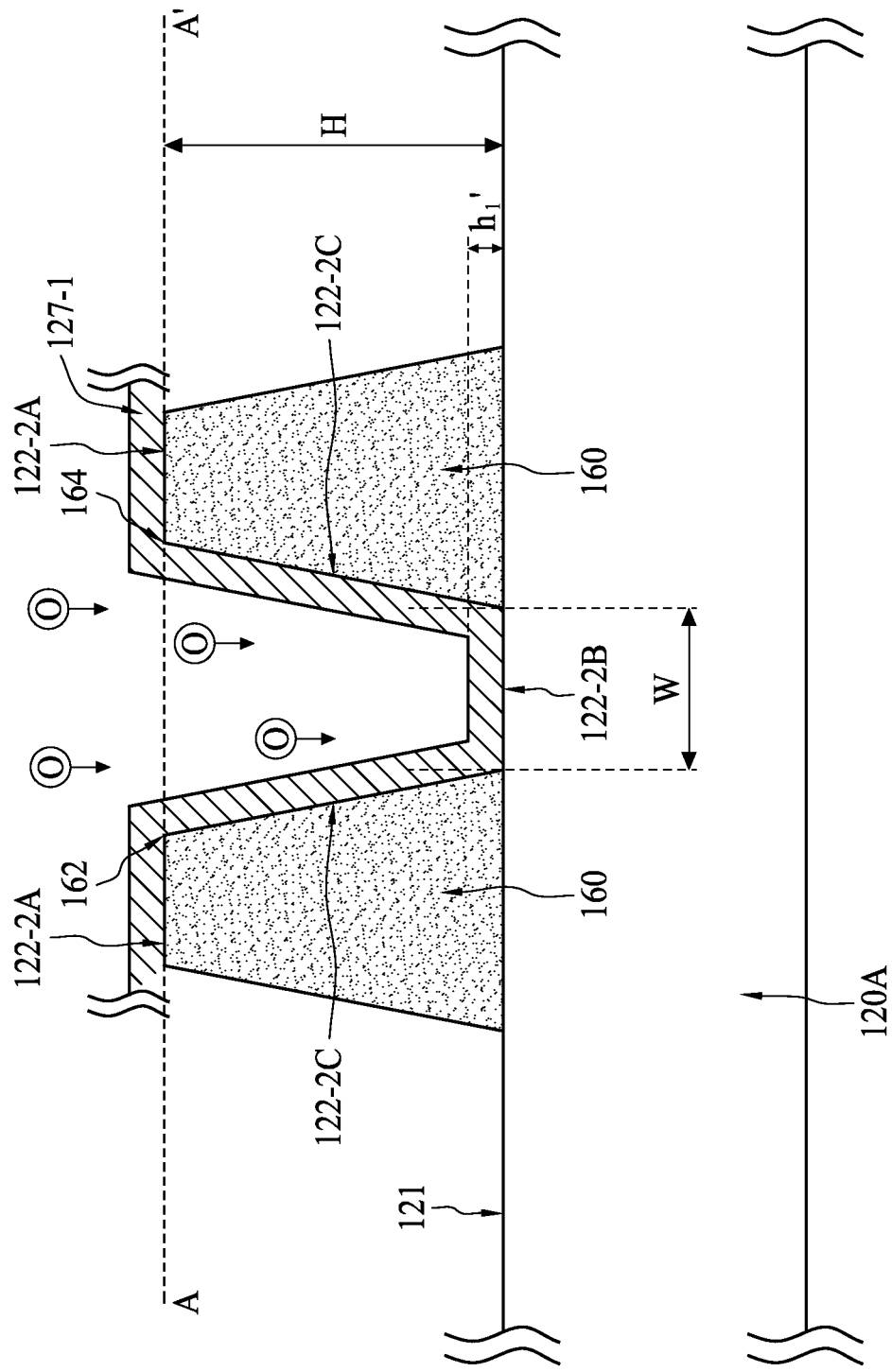

FIG. 9D is used to illustrate an operation to treat a top surface of the dielectric layer 127-1 with plasma. In some embodiments with reference to FIG. 9D, the plasma includes oxygen ions.

Figure 9E:
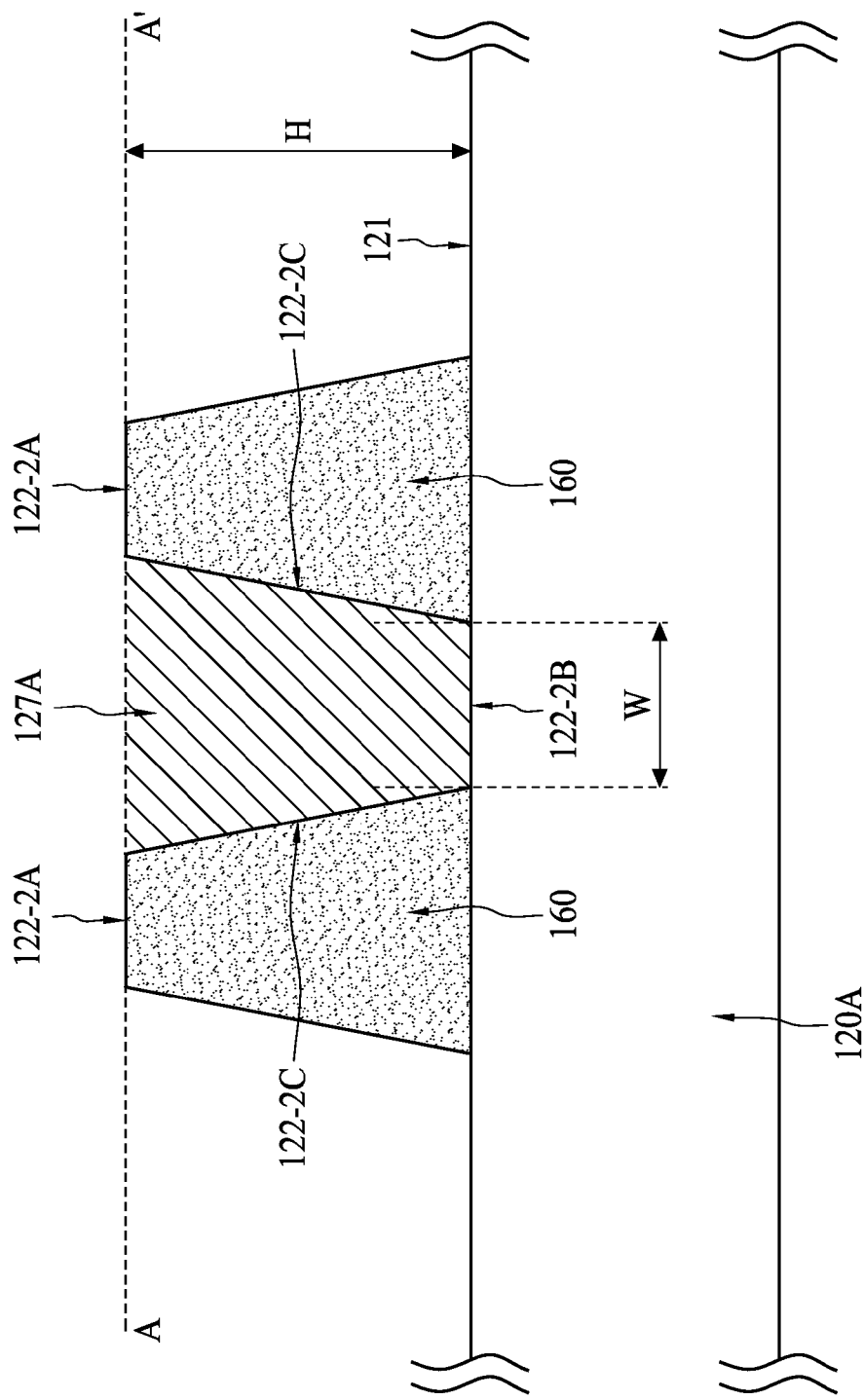

In some embodiments, several cycles are used to form the dielectric material 127 to a predetermined height. For example, operations with reference to FIGS. 9B to 9D are repeated to form a cycle to form the dielectric layer 127-1. In some embodiments as illustrated in FIG. 9E, an operation that repeats the cycle 6-7 times is used to form the dielectric material 127 having the thickness H.

In some embodiments, a semiconductor structure includes a surface having a plurality of portions and a dielectric material over the surface. The dielectric material includes an aspect ratio that is substantially equal to or greater than a predetermined value.

In some embodiments, a semiconductor structure includes conductors and a spacer disposed on a sidewall of each conductor of the conductors. The semiconductor structure has a liner on the spacer and a top surface of each conductor of the conductors. The semiconductor structure also has a phosphorous doped dielectric material between two conductors and the phosphorous concentration throughout the phosphorous doped dielectric material is substantially constant.

In some embodiments, a method of manufacturing a semiconductor structure includes forming a surface, forming a dielectric layer over the surface, etching the dielectric layer, and treating a top surface of the dielectric layer with plasma.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method of manufacturing a semiconductor structure, comprising:
    forming a surface having a trench profile on a substrate;
    depositing a silicate layer over the surface with an in-situ sputtering operation, the silicate layer comprising an overhang in proximity to a top of the trench profile upon a completion of the forming the dielectric layer;
    etching the silicate layer with a fluorine-based etchant until the overhang is removed;
    treating a top surface of the silicate layer with oxygen plasma; and
    repeating the depositing, the etching, and the treating operations until the trench profile being filled with a plurality of silicate layers,
    wherein a fluorine concentration in the plurality of silicate layers monotonically decreases from about 2 E20 atoms/cm$^3$ at a bottom of the trench profile to about 1 E20 atoms/cm$^3$ at a top of the trench profile.

2. The method of claim 1, wherein etching the silicate layer comprises applying NF$_3$ etch.

3. The method of claim 1, further comprising forming a liner between the surface and the silicate layer.

4. A method of manufacturing a dielectric structure, comprising:
    forming a surface profile over a substrate, the surface profile being composed of a top surface of a conductor, a sidewall surface of the conductor, and a top surface of the substrate, wherein a bottom surface of the conductor is in direct contact with the top surface of the substrate;
    forming a first spacer;
    forming a liner over the first spacer;
    depositing a dielectric layer over the surface profile;
    in-situ sputtering the dielectric layer; and
    treating a top surface of the dielectric layer with plasma, repeating the depositing, the in-situ sputtering, and the treating operations until the surface profile being filled with a plurality of dielectric layers;
    wherein a fluorine concentration in the plurality of dielectric layers monotonically decreases from about 2 E20 atoms/cm$^3$ at a bottom of the surface profile to about 1 E20 atoms/cm$^3$ at a top of the surface profile.

5. The method of claim 4, further comprising forming a second spacer over the first spacer.

6. The method of claim 4, wherein the dielectric structure comprises an aspect ratio greater than about 2.4.

7. The method of claim 4, wherein in-situ sputtering comprises removing a portion of the dielectric layer by argon ions.

8. The method of claim 4, further comprising performing a fluorine ion etch before treating the top surface of the dielectric layer.

9. The method of claim 4, wherein treating the top surface of the dielectric layer with plasma comprises applying phosphorous plasma.

10. A method of filling a dielectric trench, comprising:
    forming two adjacent conductors on a substrate thereby obtaining a trench profile having a trench depth;
    forming a dielectric layer over the trench profile with an in-situ sputtering operation, the dielectric layer comprising an overhang in proximity to a top of the trench profile upon a completion of the forming the dielectric layer;
    removing at least the overhang of the dielectric layer with a fluorine-based etchant and rendering the dielectric layer to possess about one-sixth of the trench depth;
    treating a top surface of the dielectric layer with phosphorous plasma, and
    repeating the forming the dielectric layer, the removing at least the overhang of the dielectric layer, and the treating the top surface of the dielectric layer in a multi cycle fashion until the dielectric layer achieving the trench depth,
    wherein a fluorine concentration in the dielectric layer achieving the trench depth monotonically decreases from about 2 E20 atoms/cm$^3$ at a bottom of the trench profile to about 1 E20 atoms/cm$^3$ at a top of the trench profile while a substantial constant phosphorous concentration being maintained throughout the dielectric layer achieving the trench depth.

11. The method of claim 10, wherein removing the portion of the dielectric layer comprises applying an $NF_3$ etch.

12. The method of claim 10, wherein treating the top surface of the dielectric layer with phosphorous plasma comprises;
   applying a first radio frequency power to form the plasma; and
   applying a second radio frequency power to accelerate the plasma,
   wherein the first radio frequency power and the second radio frequency power are substantially in a same range.

13. The method of claim 12, wherein the first radio frequency power is in a range of from about 1000 W to about 9000 W.

14. The method of claim 10, wherein a narrowest width of the dielectric trench between the two adjacent conductors is smaller than about 30 nm.

15. The method of claim 10, wherein the forming the dielectric layer comprises performing phosphorous-doped silicon glass deposition operation.

16. The method of claim 10, wherein the in-situ sputtering operation comprises removing a portion of the dielectric layer by argon ions.

* * * * *